US010978390B2

(12) United States Patent
Kim et al.

(10) Patent No.: US 10,978,390 B2
(45) Date of Patent: Apr. 13, 2021

(54) ELECTRONIC DEVICE INCLUDING SWITCHING ELEMENT AND SEMICONDUCTOR MEMORY

(71) Applicant: SK hynix Inc., Icheon-Si (KR)

(72) Inventors: Dong-Joon Kim, Icheon-si (KR); Jae-Yun Yi, Icheon-si (KR); Joon-Seop Sim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 86 days.

(21) Appl. No.: 15/333,045

(22) Filed: Oct. 24, 2016

(65) Prior Publication Data
US 2017/0154844 A1 Jun. 1, 2017

(30) Foreign Application Priority Data

Nov. 30, 2015 (KR) .......................... 10-2015-0168569

(51) Int. Cl.
H01L 23/528 (2006.01)
H01L 27/24 (2006.01)
H01L 27/22 (2006.01)
G11C 13/00 (2006.01)
(Continued)

(52) U.S. Cl.
CPC .......... *H01L 23/528* (2013.01); *H01L 27/228* (2013.01); *H01L 27/2436* (2013.01); *H01L 27/2463* (2013.01); *G11C 11/1659* (2013.01); *G11C 11/2255* (2013.01);
(Continued)

(58) Field of Classification Search
None
See application file for complete search history.

(56) References Cited

U.S. PATENT DOCUMENTS 8,129,709 B2    3/2012 Seko et al.
9,147,442 B2 *  9/2015 Yi ...................... G11C 13/0028
9,377,955 B2 *  6/2016 Lee ........................ G06F 3/061
(Continued)

FOREIGN PATENT DOCUMENTS

CN    102737708 A    1/2020
KR    10-1227675 B1   1/2013
(Continued)

OTHER PUBLICATIONS

Office Action for Chinese Patent Application No. 201610921693.7 dated Jan. 6, 2020 (12 pages including English translation).

Primary Examiner — Abul Kalam
(74) Attorney, Agent, or Firm — Perkins Coie LLP

(57) ABSTRACT

An electronic device including a semiconductor memory is provided to include a mat region comprising a plurality of memory cells, each including a second transistor; a first switching region located at a side of the mat region and including first transistors; and a second switching region located at the other side of the mat region and including third transistors, wherein the second transistors comprise: a plurality of second active regions; and a plurality of second gate structures extending in the first direction to cross the second active regions, wherein each second active regions is divided into a first side portion, a middle portion and a second side portion that are arranged alternately and repeatedly in the first direction, wherein the first transistors and the third transistors include their active regions and gate structures which are arranged in the same manner as those of the second transistors.

19 Claims, 32 Drawing Sheets

(51) Int. Cl.
*G11C 11/22* (2006.01)
*G11C 11/16* (2006.01)

(52) U.S. Cl.
CPC ...... *G11C 13/0026* (2013.01); *G11C 2213/79* (2013.01); *G11C 2213/82* (2013.01)

(56) References Cited

U.S. PATENT DOCUMENTS

| | | | |
|---|---|---|---|
| 9,520,187 B2* | 12/2016 | Yi | G11C 13/0028 |
| 9,773,840 B2* | 9/2017 | Kang | H01L 27/2436 |
| 2010/0123114 A1* | 5/2010 | Seko | H01L 27/2436 |
| | | | 257/2 |
| 2011/0157951 A1 | 6/2011 | Hung et al. | |
| 2013/0343113 A1* | 12/2013 | Matsuda | G11C 11/161 |
| | | | 365/69 |
| 2014/0256103 A1* | 9/2014 | Kim | H01L 21/283 |
| | | | 438/270 |
| 2014/0293672 A1* | 10/2014 | Yi | H01L 27/2463 |
| | | | 365/72 |
| 2015/0249111 A1* | 9/2015 | Kang | H01L 27/2436 |
| | | | 710/308 |
| 2015/0261437 A1* | 9/2015 | Lee | G06F 3/061 |
| | | | 710/5 |
| 2015/0302917 A1 | 10/2015 | Grover et al. | |

FOREIGN PATENT DOCUMENTS

| | | |
|---|---|---|
| KR | 10-2014-0023806 A | 2/2014 |
| KR | 10-2014-0118143 A | 10/2014 |
| TW | I246183 B | 12/2005 |

* cited by examiner

ELECTRONIC DEVICE INCLUDING SWITCHING ELEMENT AND SEMICONDUCTOR MEMORY

CROSS-REFERENCE TO RELATED APPLICATION

Under 35 U.S.C. § 119, this patent document claims priority of Korean Patent Application No. 10-2015-0168569, entitled "ELECTRONIC DEVICE AND METHOD FOR FABRICATING THE SAME" and filed on Nov. 30, 2015, which is incorporated herein by reference in its entirety.

BACKGROUND

This patent document relates to semiconductor memory circuits or devices and their applications in electronic devices or systems.

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device including a switching element and a semiconductor memory capable of improving characteristics of memory cells, increasing a degree of integration, and reducing a cost and a level of difficulty of fabricating processes are provided.

In an implementation, an electronic device includes semiconductor memory, and the semiconductor memory may include a mat region comprising a plurality of memory cells, each of the memory cells including a second transistor and a memory element coupled to the second transistor; a first switching region located at a side of the mat region and including a plurality of first transistors coupled to first ends of the memory cells; and a second switching region located at the other side of the mat region with respect to the first switching region and including a plurality of third transistors coupled to second ends of the memory cells, wherein the second transistors comprise: a plurality of second active regions elongated in a third direction that crosses first and second directions which are substantially perpendicular to each other, the plurality of second active regions being arranged in a row in the second direction and the third direction; and a plurality of second gate structures extending in the first direction to cross the second active regions, wherein each of the second active regions is divided into a first side portion, a middle portion and a second side portion by a pair of the second gate structures, and the first side portion, the second side portion and the middle portion are arranged alternately and repeatedly in the first direction, wherein the first transistors include first active regions and first gate structures which are arranged in the same manner as the second active regions and the second gate structures, and wherein the third transistors include third active regions and third gate structures which are arranged in the same manner as the second active regions and the second gate structures.

Implementations of the above device may include one or more of the following.

The mat region further comprises: second source line contacts, each located over and coupled to the middle portion of the second active region; stack structures, each including a lower contact and the memory element, and located over and coupled to each of the first side portion and the second side portion of the second active region; upper contacts, each located over and commonly coupled to a pair of the stack structures which are adjacent to each other in the first direction while not overlapping the second source line contacts; second source lines, each located over and coupled to the second source line contacts, and extending in the second direction; and second bit lines, each located over and coupled to the upper contacts, and extending in the second direction. The second bit lines are located over and overlap the second source lines, respectively. The stack structures further comprise additional upper contacts, and each of the additional upper contacts is located over and coupled to the memory element. A bottom surface of the memory element is located over a top surface of the second source line. A top surface of the memory element is located under a bottom surface of the second source line, and a top surface of the second source line is located under a bottom surface of the second bit line. When the first active regions arranged in the second direction are referred to as a first active region row, a plurality of first active region rows are arranged in the first direction, and a selected first gate structure of the first gate structures crosses a selected first active region row of the first active region rows, and when the third active regions arranged in the second direction are referred to as a third active region row, a plurality of third active region rows are arranged in the first direction, and a selected third gate structure of the third gate structures crosses a selected third active region row of the third active region rows, the first switching region further comprises: first source line contacts and first bit line contacts, each first source line contact and each first bit line contact being located over and coupled to the selected first active region while being located at both sides of the selected first gate structure, respectively; first source lines, each located over and coupled to the first source line contact, and extending in the second direction; and first bit lines, each located over and coupled to the first bit line contact, and extending in the second direction, and the second switching region further comprises: third source line contacts and third bit line contacts, each third source line contact and each third bit line contact being located over and coupled to the selected third active region while being located at both sides of the selected third gate structure, respectively; third source lines, each located over and coupled to the third source line contact, and extending in the second direction; and third bit lines, each located over and coupled to the third bit line contact, and extending in the second direction. The first bit lines and the second bit lines are electrically coupled to each other, respectively, while the first source lines and the second source lines are electrically separated from each other, and the second source lines and the third source lines are electrically coupled to each other, respectively, while the second bit lines and the third bit lines are electrically separated from each other. The first to third source lines are located at a same height, and the first to third bit lines are located at a same height and over the first to third source lines. In the first direction, the first bit lines and the second bit lines are formed in positions corresponding to each other, and the second source lines and the third source lines are formed in positions corresponding to each other. In the first direction, the first bit lines and the second bit lines are formed in different positions, and the semiconductor memory further comprises: lines having curved shapes, provided between the first switching region and the mat region and coupling the first bit lines and the second bit lines with each other. The first source line contacts are arranged in a row along a fourth direction which crosses the first to third directions, the first bit line contacts are arranged in a row along the fourth direction, the third source line contacts are arranged in a row along the fourth direction, and the third bit line contacts are arranged in a row along the fourth direction. When the first source line contact and the first bit line contact are located at a first side and a second side of the selected first gate structure, respectively, the third source line contact and the third bit line contact are located at a second side and a first side of the selected third gate structure, respectively. The first source lines and the first bit lines are arranged alternately and repeatedly in the first direction, the third source lines and the third bit lines are arranged alternately and repeatedly in the first direction, and in the first direction, the first bit lines, the second source lines, the second bit lines and the third source lines are formed in positions corresponding to each other. When the first source line contact and the first bit line contact are located at a first side and a second side of the selected first gate structure, respectively, the third source line contact and the third bit line contact are located at a first side and a second side of the selected third gate structure, respectively. The first source lines and the first bit lines are arranged alternately and repeatedly in the first direction, the third source lines and the third bit lines are arranged alternately and repeatedly in the first direction, and in the first direction, the first source lines, the second source lines, the second bit lines and the third source lines are formed in positions corresponding to each other. The first switching region further comprises: additional first bit line contacts, each located over and coupled to the first bit line contact while protruding toward the first source line which is adjacent to and located at a side of the first bit line contact to overlap the first source line, and the first bit line is located over and coupled to the additional first bit line contact while extending in the second direction to overlap the first source line. The third source lines and the third bit lines are arranged alternately and repeatedly in the first direction, and in the first direction, the first source lines, the first bit lines, the second source lines, the second bit lines and the third source lines are formed in positions corresponding to each other. The first switching region further comprises: first line contacts, each located between two adjacent first gate structures and extending in the first direction to couple the first active regions which are arranged in the first direction to each other, the second switching region further comprises: second line contacts, each located between two adjacent third gate structures and extending in the first direction to couple the third active regions which are arranged in the first direction to each other, the first source line contacts and the first bit line contacts are located over and coupled to the first line contacts, and the third source line contacts and the third bit line contacts are located over and coupled to the second line contacts. A current flow passing the first source line—the first source line contact—the first transistor—the first bit line contact—the first bit line—the second bit line—the upper contact—the memory element—the lower contact—the second transistor—the second source line contact—the second source line—the third source line—the third source line contact—the third transistor—the third bit line contact—the third bit line in a forward direction or reverse direction is generated. The semiconductor memory further comprises: a global bit line coupled to the first source lines through global bit line contacts; and a global source line coupled to the third bit lines through global source line contacts. The global bit line and the global source line are located at a same height as the first to third bit lines. The global bit line contacts are formed of a same material and at a same height as upper portions of the first bit line contacts. The global source line contacts are formed of a same material and at a same height as the upper contacts. The memory element includes a variable resistance element which switches between different resistance states according to an applied voltage or current.

In another aspect, an electronic device includes semiconductor memory, and the semiconductor memory may include a plurality of active regions elongated in a third direction, the third direction crossing first and second directions which are substantially perpendicular to each other, and arranged in a row in the second direction and the third direction; a plurality of gate structures extending in the first direction to cross the active regions, wherein each of the active regions is divided into a first side portion, a middle portion and a second side portion by a pair of the gate structures, and the first side portion, the second side portion and the middle portion are arranged alternately and repeatedly in the first direction; source line contacts, each located over and coupled to the middle portion of the active region; stack structures, each including a lower contact and a memory element, and located over and coupled to each of the first side portion and the second side portion of the active region; upper contacts, each located over and commonly coupled to a pair of the stack structures which are adjacent to each other in the first direction while not overlapping the source line contacts; source lines, each located over and coupled to the source line contacts, and extending in the second direction; and bit lines, each located over and coupled to the upper contacts, and extending in the second direction.

Implementations of the above device may include one or more of the following.

The bit lines are located over and overlap the source lines, respectively. The stack structures further comprise additional upper contacts, and each of the additional upper contacts is located over and coupled to the memory element. A bottom surface of the memory element is located over a top surface of the source line. A top surface of the memory element is located under a bottom surface of the source line, and a top surface of the source line is located under a bottom surface of the bit line. The memory element includes a variable resistance element which switches between different resistance states according to an applied voltage or current.

In another aspect, an electronic device includes a switching element, and the switching element may include a plurality of active regions elongated in a third direction, the third direction crossing first and second directions which are substantially perpendicular to each other, and arranged in a row in the second direction and the third direction; and a plurality of gate structures extending in the first direction to cross the active regions, wherein each of the active regions is divided into a first side portion, a middle portion and a second side portion by a pair of the gate structures, and the first side portion, the second side portion and the middle portion are arranged alternately and repeatedly in the first direction; when the active regions arranged in the second direction are referred to as an active region row, a plurality of active region rows are arranged in the first direction, and a selected gate structure of the gate structures crosses a selected active region row of the active region rows, source line contacts and bit line contacts, each source line contact and each bit line contact being located over and coupled to the selected active region while being located at both sides of the selected gate structure, respectively; source lines, each located over and coupled to the source line contact, and extending in the second direction; and bit lines, each located over and coupled to the bit line contact, and extending in the second direction.

Implementations of the above device may include one or more of the following.

The bit lines are located over the source lines. The source line contacts are arranged in a row along a fourth direction which crosses the first to third directions, and the bit line contacts are arranged in a row along the fourth direction. The source lines and the bit lines are arranged alternately and repeatedly in the first direction. The switching element further comprises: additional bit line contacts, each located over and coupled to the bit line contact while protruding toward the source line which is adjacent to and located at a side of the bit line contact to overlap the source line, and the bit line is located over and coupled to the additional bit line contact while extending in the second direction to overlap the source line. The switching element further comprises: line contacts, each located between two adjacent gate structures and extending in the first direction to couple the active regions which are arranged in the first direction to each other, and the source line contacts and the bit line contacts are located over and coupled to the line contacts. A current flow passing the source line—the source line contact—a channel formed in the active region and located under the selected gate structure—the bit line contact—the bit line in a forward direction or reverse direction is generated.

In another aspect, an electronic device includes semiconductor memory, and the semiconductor memory may include a mat region including a plurality of memory cells; a first switching region including a plurality of first transistors which are located between a plurality of first source lines and a plurality of first bit lines, and are coupled to first ends of the memory cells through the first bit lines; and a second switching region including a plurality of third transistors which are located between a plurality of third source lines and a plurality of third bit lines and coupled to second ends of the memory cells through the third source lines, wherein, gates of two or more of the first transistors of the first transistors are commonly coupled to a first gate line extending in a direction, a source of a selected first transistor of the two or more first transistors is coupled to a selected first source line of the first source lines, and a drain of the selected first transistor of the two or more first transistors is coupled to a selected first bit line of the first bit lines, and when gates of two or more third transistors of the third transistors are commonly coupled to a third gate line extending in a direction, a source of a selected third transistor of the two or more third transistors is coupled to a selected third source line of the third source lines, and a drain of the selected third transistor of the two or more third transistors is coupled to a selected third bit line of the third bit lines.

Implementations of the above device may include one or more of the following.

Sources of the N first transistors are coupled to each other, drains of the two or more first transistors are coupled to each other, sources of the two or more third transistors are coupled to each other, and drains of the two or more third transistors are coupled to each other. The first source lines are commonly coupled to a global bit line, and the third bit lines are commonly coupled to a global source line. A current flow passing the selected first source line—the selected first transistor—the selected first bit line—the memory cell—the selected third source line—the selected third transistor—the selected third bit line in a forward direction or reverse direction is generated. A current flow passing the selected first source line—the two or more first transistors—the selected first bit line—the memory cell—the selected third source line—the two or more third transistors—the selected third bit line in a forward direction or reverse direction is generated.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

These and other aspects, implementations and associated advantages are described in greater detail in the drawings, the description and the claims.

DETAILED DESCRIPTION

Figure 1:
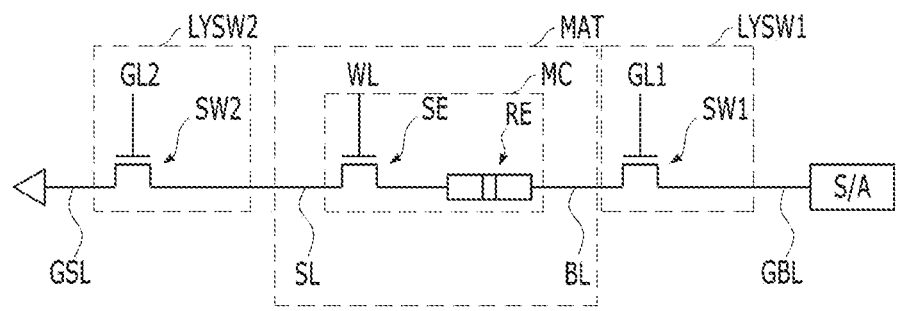
FIG. 1 is a schematic diagram illustrating an example of a semiconductor memory in accordance with an implementation of the disclosed technology.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIG. 1 is a schematic diagram illustrating an example of a semiconductor memory in accordance with an implementation of the disclosed technology, and shows a memory cell and a portion of the memory device circuitry having elements coupled to the memory cell for input and output of data.

Referring to FIG. 1, the memory cell MC may include a variable resistance element RE which exhibits different resistance states and can switch between the different resistance states according to a voltage or current applied to both ends of the variable resistance element RE, and a selection element SE which is coupled to one end of the variable resistance element RE and controls an access to the variable resistance element RE.

The variable resistance element RE may include a single-layered structure or multi-layered structure that includes materials used in an RRAM, a PRAM, an MRAM, an FRAM, etc. For example, the variable resistance element RE may include a metal oxide such as a transition metal oxide, a perovskite-based material and the like, a phase change material such as a chalcogenide-based material and the like, a ferroelectric material, or a ferromagnetic material. For another example, the variable resistance element RE may include an MTJ (Magnetic Tunnel Junction) structure in which a tunnel barrier layer is interposed between two ferromagnetic layers and can be configured to operate based on Spin Transfer Torque (STT) as a magnetic RAM (MRAM) cell.

The selection element SE may include a transistor which is turned on or off by a voltage applied to a word line WL.

The memory cell MC may store data using a resistance change characteristic of the variable resistance element RE based on different resistance states corresponding to different resistance values. For example, when the variable resistance element RE is in a low resistance state, the memory cell MC may store data '1'. On the other hand, when the variable resistance element RE is in a high resistance state, the memory cell MC may store data '0'.

Both ends of the memory cell MC may be coupled to a bit line BL and a source line SL, respectively. Specifically, the variable resistance element RE may be a two-terminal element, and one end of the variable resistance element RE may be coupled to the selection element SE and the other end of the variable resistance element RE may be coupled to the bit line BL. The selection element SE may be a three-terminal transistor which has a gate, a source and a drain. The gate, the source and the drain of the selection element SE may be coupled to the word line WL, the source line SL and the variable resistance element RE, respectively.

The source line SL may be coupled to a certain voltage applier, for example, a ground through a global source line GSL, and the bit line BL may be coupled to a sense amplifier S/A for sensing and amplifying the data of the memory cell MC through a global bit line GBL. Here, a first switching element SW1 and a second switching element SW2 may be positioned between the bit line BL and the global bit line GBL and between the source line SL and the global source line GSL, respectively, to control a connection between the bit line BL and the global bit line GBL and between the source line SL and the global source line GSL, respectively. In some implementations, each of the first and second switching elements SW1 and SW2 may be a transistor which has three terminals, that is, a gate, a source and a drain. The gate, the source and the drain of the first switching element SW1 may be coupled to a first gate line GL1, the global bit line GBL and the bit line BL, respectively. Also, the gate, the source and the drain of the second switching element SW2 may be coupled to a second gate line GL2, the source line SL and the global source line GSL, respectively In various implementations, a plurality of the memory cells MC may be disposed in a mat region MAT. In FIG. 1, a portion of this mat region MAT is illustrated to include one of the memory cells MC. In addition, FIG. 1 shows first and second switching regions LYSW1 and LYSW2 on two opposite sides of the mat region MAT. Specifically, FIG. 1 shows that a plurality of the first switching elements SW1 for controlling the memory cells MC may be disposed in the first switching region LYSW1 which is located at a first side of the mat region MAT; a plurality of the second switching elements SW2 for controlling the memory cells MC may be disposed in the second switching region LYSW2 which is located at a second side of the mat region MAT which is at an opposite side of the first switching region LYSW1. The memory cells MC disposed in the mat region MAT may be arranged in various types or configurations to constitute a cell array. For example, a plurality of the bit lines BL, a plurality of the source lines SL, and a plurality of the word lines WL may be disposed in the mat region MAT to cross the mat region MAT, and each of the memory cells MC may be coupled to a corresponding bit line BL, a corresponding source line SL, and a corresponding word line WL and controlled by them. Furthermore, since the source lines SL and the bit lines BL are disposed in the mat region MAT, a plurality of the first and second switching elements SW1 and SW2 may be disposed in the first and second switching regions LYSW1 and LYSW2, respectively. For example, the first switching elements SW1 for controlling a connection between the bit lines BL and the global bit line GBL may be disposed in the first switching region LYSW1. The first switching elements SW1 may be arranged in various types or configurations to constitute an array. Also, the second switching elements SW2 for controlling a connection between the source lines SL and the global source line GSL may be disposed in the second switching region LYSW2. The second switching elements SW2 may be arranged in various types or configurations to constitute an array.

In a semiconductor memory, a plurality of the mat regions MAT, a plurality of the first switching regions LYSW1 and a plurality of the second switching regions LYSW2 may be provided. Arrangements of the mat regions MAT, the first switching regions LYSW1 and the second switching regions LYSW2 may be exemplarily described with reference to FIG. 2.

Figure 2:
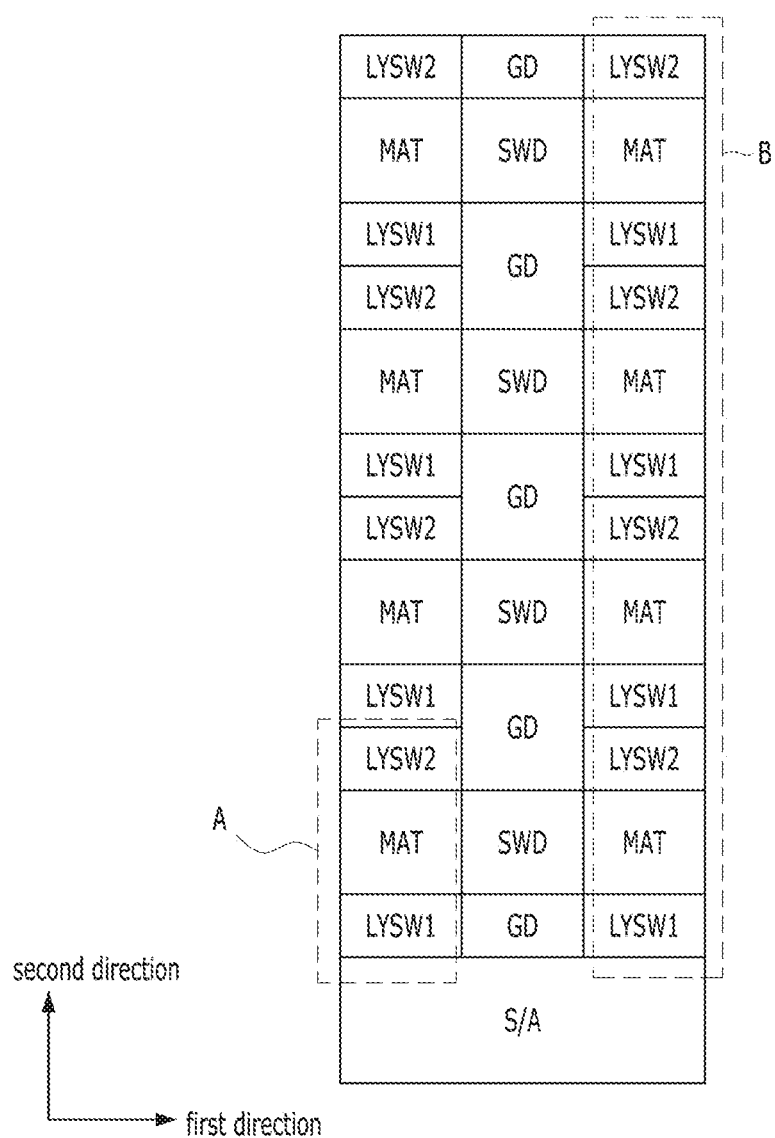
FIG. 2 is a block diagram illustrating an example of a semiconductor memory in accordance with an implementation.

FIG. 2 is a block diagram illustrating an example of a semiconductor memory in accordance with an implementation of the disclosed technology including multiple mat regions MAT each including memory cells MC.

Referring to FIG. 2, the semiconductor memory may include a plurality of mat regions MAT. Each mat region MAT includes different memory cells MC coupled to their respective word lines, source lines and bit lines as shown in FIG. 1. The mat regions MAT may be arranged in a matrix form along a first direction and a second direction. In the present implementation, 8 mat regions MAT of 4*2 are illustrated, but other implementations are also possible. The numbers and arrangements of the mat regions MAT may be selected changed in various ways.

A word line driver SWD for controlling a plurality of word lines WL may be disposed at one side of each of the mat regions MAT in a direction, for example, in the first direction. For example, as shown in FIG. 2, the word line driver SWD may be disposed between two mat regions MAT that are adjacent to each other in the first direction. In such a case, although not shown, a plurality of word lines WL disposed in each mat region MAT for different memory cells MC may be extended in the first direction and coupled with a corresponding word line driver SWD.

Furthermore, the aforementioned first and second switching regions LYSW1 and LYSW2 may be disposed at both sides of each of the mat regions MAT in another direction, for example, in the second direction that may be perpendicular to the first direction. For example, the first switching region LYSW1 including the first switching elements SW1 for coupling the bit lines BL of different memory cells MC inside the mat region MAT to the global bit line GBL may be located at one side of each of the mat regions MAT in the second direction, and the second switching region LYSW2 including the second switching elements SW2 for coupling the source lines SL of different memory cells MC inside the mat region MAT to the global source line GSL may be located at the other side of each of the mat regions MAT in the second direction. Although not shown, the bit lines BL of each mat region MAT may be extended in the second direction and coupled with the first switching region LYSW1, and the source lines SL of each mat region MAT may be extended in the second direction and coupled with the second switching region LYSW2.

In the above described arrangement of the mat region MAT, the first switching region LYSW1, the second switching region LYSW2 and the word line driver SWD, an empty space may be provided between adjacent two first switching regions LYSW1 and between adjacent two second switching regions LYSW2 in the first direction. Referring to FIG. 2, the locations of this empty space are lined up along the second direction and are interleaved with the word line drivers SWD in the second direction. In some implementations, various peripheral circuits may be formed in this space. For example, a gate driver GD for controlling the first and second gate lines GL1 and GL2 of the first and second switching elements SW1 and SW2 of the first and second switching regions LYSW1 and LYSW2 may be located in the empty space locations as indicated by the locations marked with "GD" in FIG. 2. Although not shown, the first and second gate lines GL1 and GL2 may be extended in the first direction and coupled with the gate driver GD.

In implementing the above design, the global bit line GBL may be coupled with the sense amplifier S/A across the mat regions MAT, the first switching regions LYSW1 and the second switching regions LYSW2 which are arranged in the second direction. Furthermore, although not shown, the global source line GSL may be coupled with a certain voltage applier, for example, a ground across the mat regions MAT, the first switching regions LYSW1 and the second switching regions LYSW2 which are arranged in the second direction.

In the above example implementation of the disclosed semiconductor memory, it is desirable to reduce an area occupied by the mat region MAT, the first switching region LYSW1 and the second switching region LYSW2 so as to increase the circuit element density in the device and to decrease a cost and a level of difficulty of fabricating processes for commercial production and use of the disclosed technology. Furthermore, since a variable resistance element is used as a memory cell, it is required to reduce the undesired impact of the resistance of other circuitry elements to the memory operation except for the variable resistance element in order to reduce an effect of additional resistance on the variable resistance element. When the resistance of the other circuitry elements increases, it is difficult to sense a difference between a resistance value in a high resistance state of the memory cell and a resistance value in a low resistance state of the memory cell. The disclosed technology provides specific structures and fabricating processes of the mat region MAT, the first switching region LYSW1 and the second switching region LYSW2 that can be used for satisfying these requirements.

FIGS. 3A to 8B are diagrams illustrating a semiconductor memory and a method for fabricating the same in accordance with an implementation. FIGS. 3A to 8A show plan views, FIGS. 3B to 8B show cross-sectional views taken along a line A1-A1', a line A2-A2', a line B-B' and a line A3-A3' of FIGS. 3A to 8A, and FIG. 3C shows a cross-sectional view taken along a line C-C' of FIG. 3A. Furthermore, FIGS. 3A to 8B show a portion of the mat region MAT, a portion of the first switching region LYSW1 and a portion of the second switching region LYSW2 of a region A of FIG. 2.

First, a fabrication method is described below.

Figure 3A:
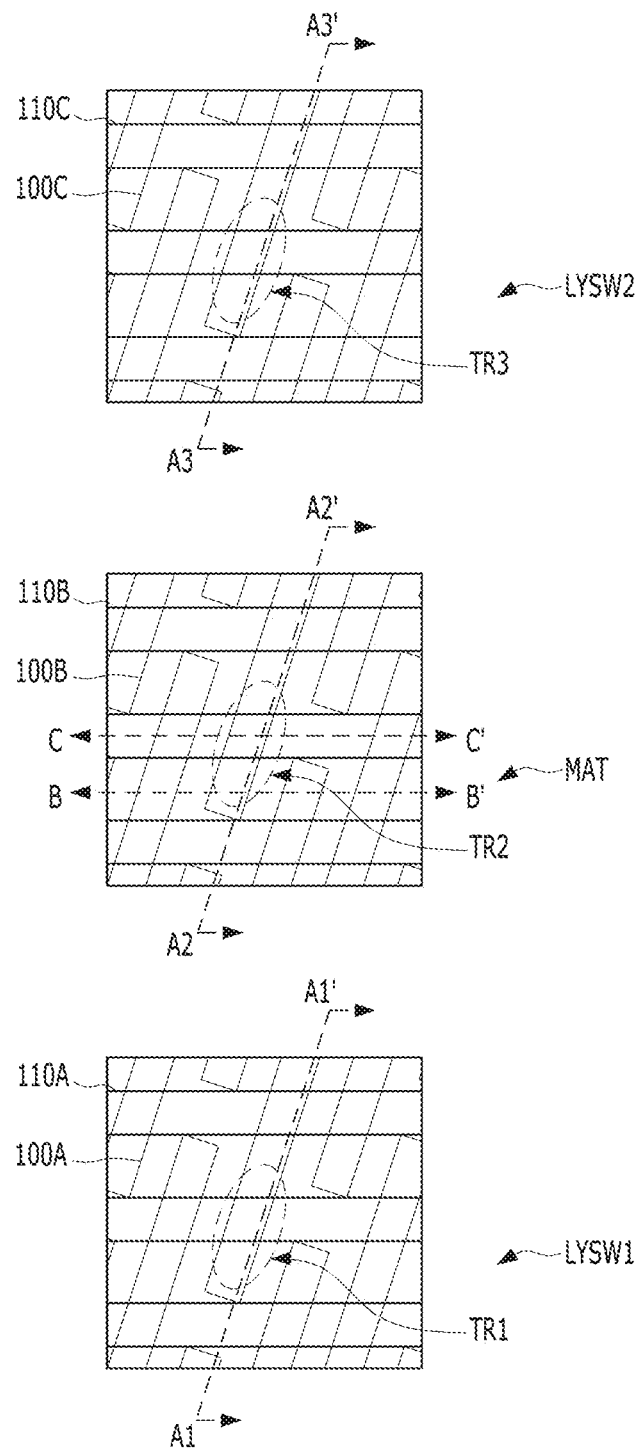
FIGS. 3A to 8B are diagrams illustrating a semiconductor memory and a method for fabricating the same in accordance with an implementation.
Figure 3B:
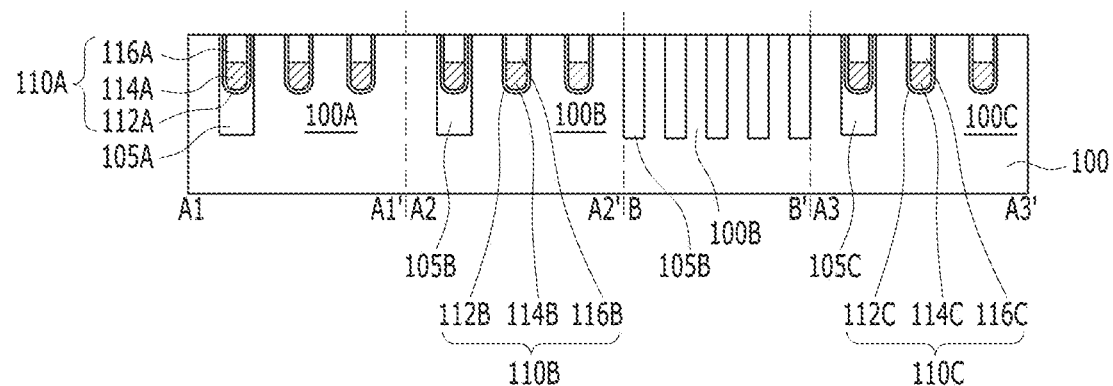

Referring to FIGS. 3A and 3B, a substrate 100 is provided to support one or more certain underlying structures, for example, a well region (not shown). The substrate 100 may include a suitable semiconductor material for the semiconductor device.

As shown in FIGS. 3A and 3B, a plurality of first active regions 100A may be defined by forming a first isolation layer 105A in the substrate 100 of the first switching region LYSW1, a plurality of second active regions 100B may be defined by forming a second isolation layer 105B in the substrate 100 of the mat region MAT, and a plurality of third active regions 100C may be defined by forming a third isolation layer 105C in the substrate 100 of the second switching region LYSW2.

In implementations, shapes and arrangements of the first to third active regions 100A, 100B and 100C may be substantially the same. Specifically, as shown in FIG. 3A, each of the first to third active regions 100A, 100B and 100C may have a bar-shape which is elongated along a major axis in a third direction. The third direction may be different from each of the first and second directions shown in FIG. 2. That is, the third direction may be a tilted direction to form a certain angle with each of the first and second directions. In each of the second and third directions, the plurality of the first active regions 100A may be arranged in a row. But, in the first direction, the first active regions 100A may be arranged repeatedly in a staggered form. More specifically, when each of the first active regions 100A is divided into three portions by first gate structures 110A which will be described later and the three portions are referred to as a first side portion, a middle portion and a second side portion, respectively, the first active regions 100A may be arranged so that a plurality of the first side portions are arranged in a row, a plurality of the middle portions are arranged in a row and a plurality of the second side portions are arranged in a row, in the second direction. Also, the first active regions 100A may be arranged so that their major axes are arranged in a row in the third direction. Also, the first active regions 100A may be arranged so that the first side portion, the second side portion and the middle portion are arranged alternately and repeatedly in the first direction. Arrangements of the second and third active regions 100B and 100C may be substantially the same as the aforementioned arrangements of the first active regions 100A, so detailed description will be skipped.

The first to third isolation layers 105A, 105B and 105C may be formed by selectively etching an isolation region of each mat region MAT, each first switching region LYSW1 and each second switching region LYSW2 of the substrate 100 to form an isolation trench, and filling the isolation trench with an insulating material, such as oxide.

After forming the isolation layers, the first gate structure 110A may be formed in the substrate 100 within the first switching region LYSW1, the second gate structure 110B may be formed in the substrate 100 with the mat region MAT, and the third gate structure 110C may be formed in the substrate 100 within the second switching region LYSW2.

Shapes and arrangements of the first to third gate structures 110A, 110B and 110C may be substantially the same in implementations. Specifically, the first gate structure 110A may cross the first active regions 100A and have a line shape which extends in the first direction. A pair of the first gate structures 110A may be arranged to cross one first active region 100A. According to the aforementioned arrangements of the first active regions 100A, one first gate structure 110A may overlap with adjacent two first active regions 100A of the first active regions 100A which are arranged in the first direction, while not overlapping with one first active region 100A which is not adjacent to the adjacent two first active regions 100A. Arrangements of the second and third gate structures 110B and 110C may be substantially the same as the aforementioned arrangements of the first gate structures 110A, so detailed description will be skipped.

The first to third gate structures 110A, 110B and 110C may be formed by following processes. First, gate trenches may be formed by selectively etching a gate formation region of each of the mat region MAT, the first switching region LYSW1 and the second switching region LYSW2 of the substrate 100, and then, first to third gate insulating layers 112A, 112B and 112C may be formed along inner walls of the gate trenches. The first to third gate insulating layers 112A, 112B and 112C may be formed by a thermal oxidation process or a deposition process of an insulating material. Then, first to third gate electrodes 114A, 114B and 114C may be formed to fill lower portions of the gate trenches in which the first to third gate insulating layers 112A, 112B and 112C are formed. The first to third gate electrodes 114A, 114B and 114C may be formed by forming a conductive material which covers a resultant structure in which the first to third gate insulating layers 112A, 112B and 112C are formed and removing a portion of the conductive material by an etch-back until the conductive material satisfies a required height. Next, first to third gate protective layers 116A, 116B and 116C may be formed to fill remaining spaces of the gate trenches in which the first to third gate insulating layers 112A, 112B and 112C and the first to third gate electrodes 114A, 114B and 114C are formed. The first to third gate protective layers 116A, 116B and 116C may be formed by forming an insulating material which covers a resultant structure in which the first to third gate insulating layers 112A, 112B and 112C and the first to third gate electrodes 114A, 114B and 114C are formed, and performing a planarization process, for example, a CMP (Chemical Mechanical Polishing) process until a top surface of the substrate 100 is exposed.

In the present implementation, the first to third gate structures 110A, 110B and 110C are buried in the substrate 100, but other implementations are also possible. For example, the first to third gate structures 110A, 110B and 110C may be located over the top surface of the substrate 100. Alternatively, for example, portions of the first to third gate structures 110A, 110B and 110C may be buried in the substrate 100 and remaining portions of the first to third gate structures 110A, 110B and 110C may protrude over the top surface of the substrate 100.

The junction regions may be formed in the first to third active regions 100A, 100B and 100C exposed by the first to third gate structures 110A, 110B and 110C. That is, the junction regions may be formed in the first side portions, the middle portions and the second side portions of the first to third active regions 100A, 100B and 100C.

In this particular example, the junction regions in the first side portion and the second side portion of the second active region 100B may serve as drain regions, and the junction region in the middle portion of the second active region 100B may serve as a common source region. On the other hand, when the junction region in one of the first side portion and the second side portion of each of the first active region 100A and the third active region 100C serves as a source region, the junction region in the middle portion of each of the first active region 100A and the third active region 100C may serve as a drain region. Also, when the junction region in one of the first side portion and the second side portion of each of the first active region 100A and the third active region 100C serves as a drain region, the junction region in the middle portion of each of the first active region 100A and the third active region 100C may serve as a source region. In the present example for implementation, the middle portion and the second side portion of the first active region 100A serve as a drain region and a source region, respectively, and the middle portion and the second side portion of the third active region 100C serve as a source region and a drain region, respectively. This will be described with reference to FIG. 4A in more detail.

The junction regions may be formed by doping impurities into the first to third active regions 100A, 100B and 100C exposed by the first to third gate structures 110A, 110B and 110C using an ion-implantation process, or performing a silicide process.

As a result, a plurality of first transistors TR1 may be formed in the first switching region LYSW1, a plurality of second transistors TR2 may be formed in the mat region MAT, and a plurality of third transistors TR3 may be formed in the second switching region LYSW2. See the three drawings in FIG. 3A showing the the formed transistors TR1, TR2 and TR3. Each of the first transistors TR1 may include the first gate structure 110A and a source region and a drain region which are located at both sides of the first gate structure 110A, each of the second transistors TR2 may include the second gate structure 110B and a source region and a drain region which are located at both sides of the second gate structure 110B, and each of the third transistors TR3 may include the third gate structure 110C and a source region and a drain region which are located at both sides of the third gate structure 110C. The first transistor TR1, the second transistor TR2 and the third transistor TR3 may correspond to the first switching element SW1, the selection element SE and the second switching element SW2 of FIG. 1, respectively.

In the process of FIGS. 3A and 3B, when etching the first to third active regions 100A, 100B and 100C and the first to third isolation layers 105A, 105B and 105C for forming the gate trenches, the first to third isolation layers 105A, 105B and 105C may be etched deeper than the first to third active regions 100A, 100B and 100C so that the first to third active regions 100A, 100B and 100C are protruded higher than the first to third isolation layers 105A, 105B and 105C within the gate trenches. In such a case, current driving abilities of the first to third transistors TR1, TR2 and TR3 may be improved and resistance of the first to third transistors TR1, TR2 and TR3 may be reduced because the first to the third gate structures 110A, 110B and 110C may surround top surfaces and side surfaces of the protruded portions of the first to third active regions 100A, 100B and 100C in the first direction. This is schematically shown in FIG. 3C.

Figure 3C:
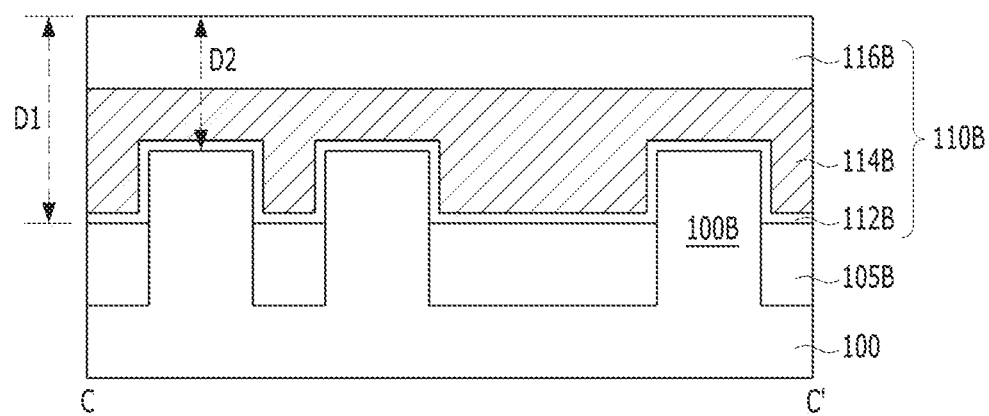

Referring to FIG. 3C, when etching for forming the gate trenches, the second isolation layer 105B may be etched up to a first depth D1 from a surface of the substrate 100, and the second active region 100B may be etched up to a second, smaller depth D2 from the surface of the substrate 100. Accordingly, the second active region 100B may be protruded higher than the second isolation layer 105B under the second gate structure 110B. The second gate structure 110B may be formed to surround the protruded portion of the second active region 100B.

Figure 4A:
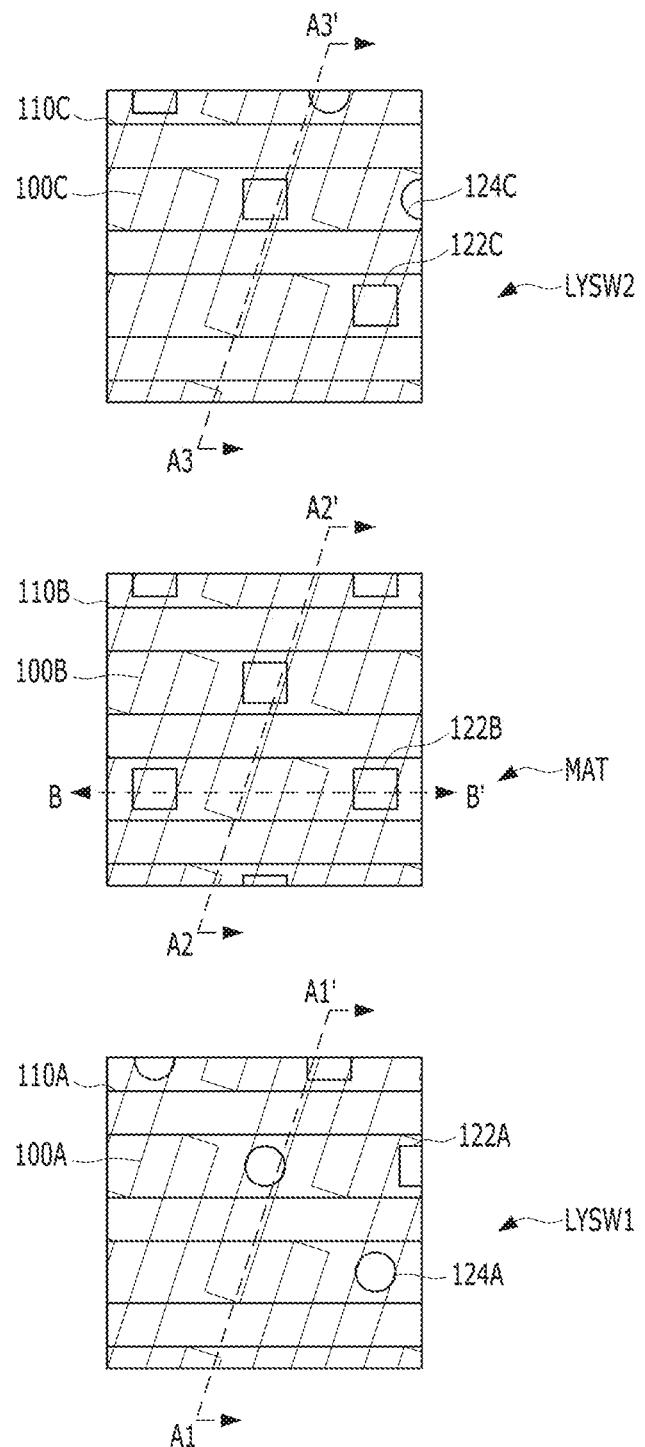
Figure 4B:
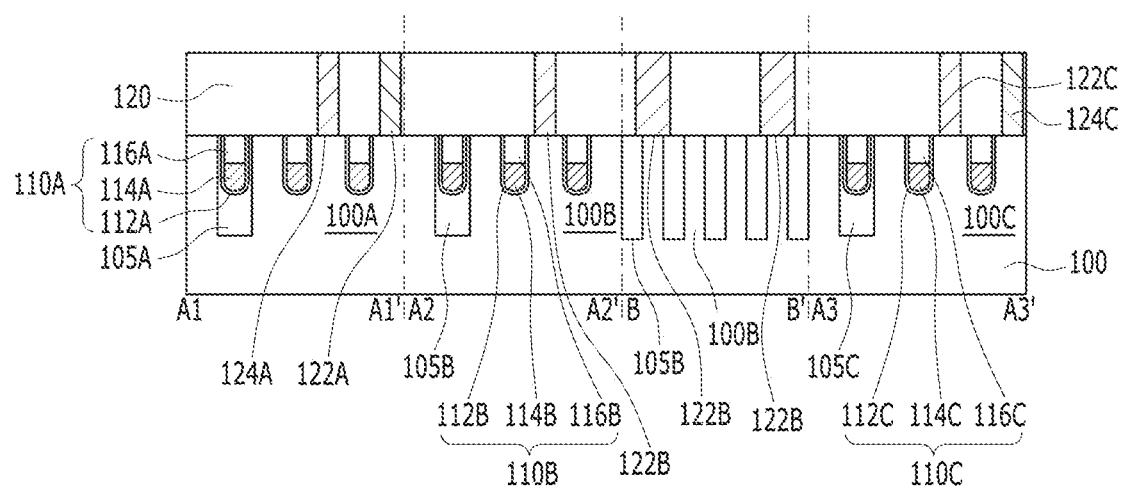

Referring to FIGS. 4A and 4B, a first interlayer insulating layer 120 to cover a resultant structure of FIGS. 3A and 3B may be formed. The first interlayer insulating layer 120 may be formed of various insulating materials, for example, a nitride, an oxide or a combination thereof.

Then, a first source line contact 122A and a first lower bit line contact 124A may be formed in the first switching region LYSW1 to penetrate through the first interlayer insulating layer 120 and be coupled to portions of the first active region 100A, a second source line contact 122B may be formed in the mat region MAT to penetrate through the first interlayer insulating layer 120 and be coupled to a portion of the second active region 100B, and a third source line contact 122C and a third lower bit line contact 124C may be formed in the second switching region LYSW2 to penetrate through the first interlayer insulating layer 120 and be coupled to portions of the third active region 100C. For reference, a source line contact may be a contact to be coupled to a source line, and a bit line contact may be a contact to be coupled to a bit line.

A plurality of the second source line contacts 122B of the mat region MAT may be arranged to be coupled to the common source regions, that is, the middle portions of the second active regions 100B, respectively.

A plurality of the first source line contacts 122A and a plurality of the first lower bit line contacts 124A of the first switching region LYSW1 may be arranged as below. As described above, the plurality of the first active regions 100A may be arranged in a row in the second direction. The first active regions 100A arranged in the second direction may be referred to as a first active region row. In the present implementation, three first active region rows which are arranged in the first direction are shown. The plurality of the first gate structures 110A may be arranged in the second direction. In the present implementation, three first gate structures 110A are shown. The first source line contacts 122A and the first lower bit line contacts 124A may be arranged so that each first source line contact 122A and each first lower bit line contact 124A are located at both sides of a selected one of the plurality of the first gate structures 110A which cross each of a plurality of the first active region rows, respectively. Here, the first source line contacts 122A and the first lower bit line contacts 124A over different first active region rows may be located at both sides of different first gate structures 110A. That is, selected first gate structures 110A crossing the different first active region rows cannot be the same as each other. Therefore, only one of the first source line contacts 122A may exist in a straight line extending in the second direction, and similarly, only one of the first lower bit line contacts 124A may exist in a straight line extending in the second direction.

Furthermore, in the present implementation, the first gate structures 110A may be sequentially selected from a side of the second direction according to the order of the first active region rows which are arranged in the first direction. For example, the first source line contact 122A and the first lower bit line contact 124A may be located at both sides of one (not shown) located just above a first one of the first gate structures 110A from the top, respectively, on a first one of the first active region rows from the left. Also, the first source line contact 122A and the first lower bit line contact 124A may be located at both sides of the first one of the first gate structures 110A from the top, respectively, on a second one of the first active region rows from the left. Also, the first source line contact 122A and the first lower bit line contact 124A may be located at both sides of a second one of the first gate structures 110A from the top, respectively, on a third one of the first active region rows from the left. Therefore, the first source line contacts 122A may be arranged in a row in a fourth direction which is different from the first to third directions, and the first lower bit line contacts 124A may be arranged in a row in the fourth direction. In this case, since the first source line contacts 122A and the first lower bit line contacts 124A which have pitches same as or similar to pitches of the second source line contacts 122B of the mat region MAT are formed in the first switching region LYSW1, it may be easier to perform a forming process of the mat region MAT and a forming process of the first switching region LYSW1 together.

Furthermore, in the present implementation, the first source line contact 122A may be located at the second side portion of the first active region 100A, and the first lower bit line contact 124A may be located at the middle portion of the first active region 100A. In this case, a bit line of the first switching region LYSW1 and a bit line of the mat region MAT may be located on a straight line in the second direction, thereby being coupled to each other more easily. However, in other implementations, locations of the first source line contact 122A and the first lower bit line contact 124A may be reversed with each other.

Arrangements of the third source line contacts 122C and the third lower bit line contacts 124C of the second switching region LYSW2 may be similar to the arrangements of the first source line contacts 122A and the first lower bit line contacts 124A of the first switching region LYSW1. That is, the third source line contacts 122C and the third lower bit line contacts 124C may be arranged so that each third source line contact 122C and each third lower bit line contact 124C are located at both sides of a selected one of the plurality of the third gate structures 110C which cross each of a plurality of third active region rows, respectively. Here, the third source line contacts 122C and the third lower bit line contacts 124C over different third active region rows may be located at both sides of different third gate structures 110C. However, unlike the first switching region LYSW1, the third source line contact 122C may be located at the middle portion of the third active region 100C, and the third lower bit line contact 124C may be located at the second side portion of the third active region 100C. In this case, a bit line of the second switching region LYSW2 and a bit line of the mat region MAT may be located on a straight line in the second direction, thereby being coupled to each other more easily. However, in other implementations, locations of the third source line contact 122C and the third lower bit line contact 124C may be reversed with each other.

The first source line contact 122A, the first lower bit line contact 124A, the second source line contact 122B, the third source line contact 122C and the third lower bit line contact 124C may be formed by forming a mask pattern (not shown) over the first interlayer insulating layer 120 to expose a region in which these contacts are to be formed, etching the first interlayer insulating layer 120 using the mask pattern as an etching barrier until the first to third active regions 100A, 100B and 100C are exposed, and filling a space formed by the etching process with a conductive material.

Figure 5A:
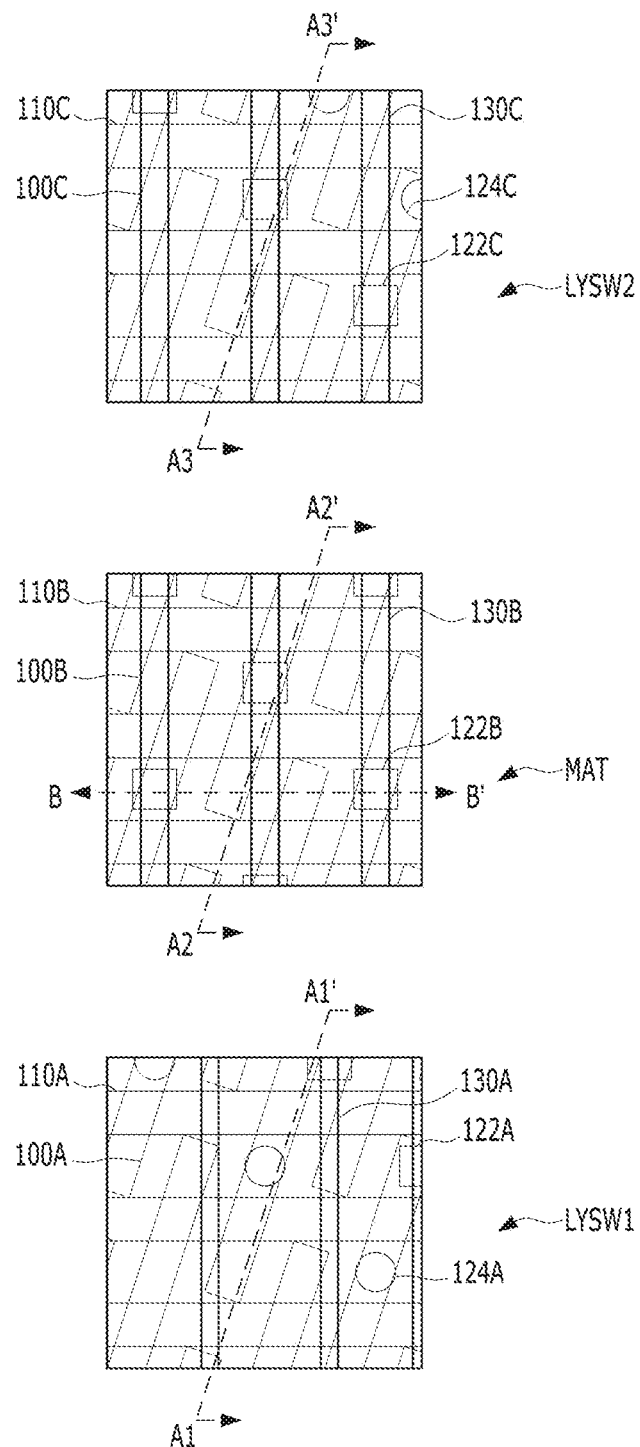
Figure 5B:
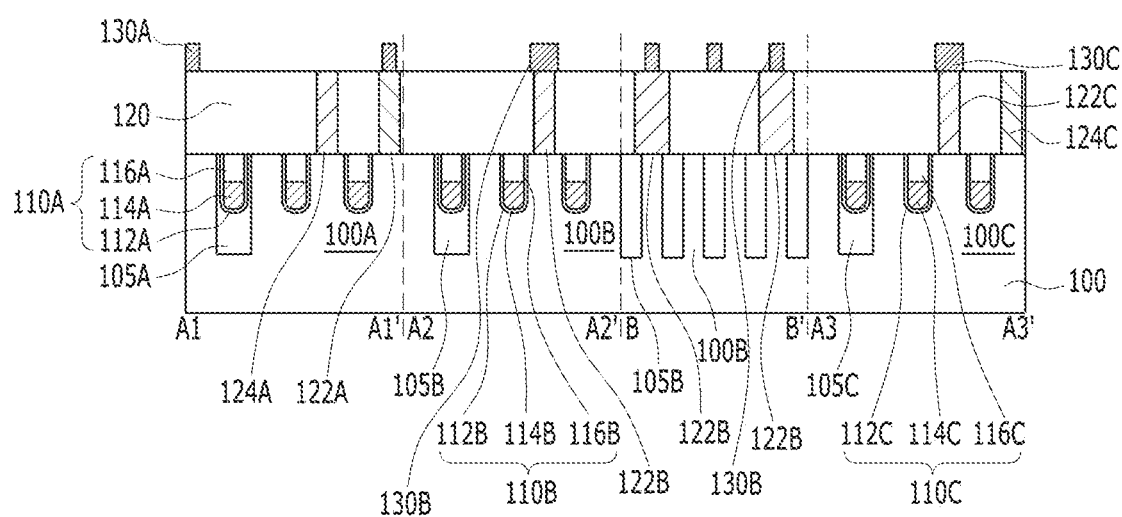

Referring to FIGS. 5A and 5B, a first source line 130A coupled to the first source line contact 122A of the first switching region LYSW1, a second source line 130B coupled to the second source line contact 122B of the mat region MAT and a third source line 130C coupled to the third source line contact 122C of the second switching region LYSW2 may be formed over a resultant structure of FIGS. 4A and 4B.

Each of a plurality of the first source lines 130A may overlap a corresponding one of the first source line contacts 122A and extend in the second direction. Each of a plurality of the third source lines 130C may overlap a corresponding one of the third source line contacts 122C and extend in the second direction. Each of a plurality of the second source lines 130B may extend in the second direction and overlap the second source line contacts 122B which are arranged in a row in the second direction.

The first to third source lines 130A, 130B and 130C may be formed by depositing a conductive material over the resultant structure of FIGS. 4A and 4B and selectively etching the conductive material. Alternatively, the first to third source lines 130A, 130B and 130C may be formed by depositing an insulating material over the resultant structure of FIGS. 4A and 4B, selectively etching the insulating material to provide a space in which the first to third source lines 130A, 130B and 130C are to be formed, and filling the space with a conductive material. Here, the first source line 130A and the second source line 130B may be electrically separated from each other, and the second source line 130B and the third source line 130C may be electrically connected with each other. Accordingly, the conductive material or insulating material for forming the second source line 130B and the third source line 130C may be patterned at one time. That is, the second source line 130B and the third source line 130C may extend between the mat region MAT and the second switching region LYSW2 to be in a direct contact with each other. In the first direction, the second source line 130B and the third source line 130C may be formed to have substantially the same width at substantially the same position. On the other hand, the first source line 130A and the second source line 130B may be cut between the first switching region LYSW1 and the mat region MAT. In the first direction, the first source line 130A and the second source line 130B may be formed at different positions and need not to have the same width.

Figure 6A:
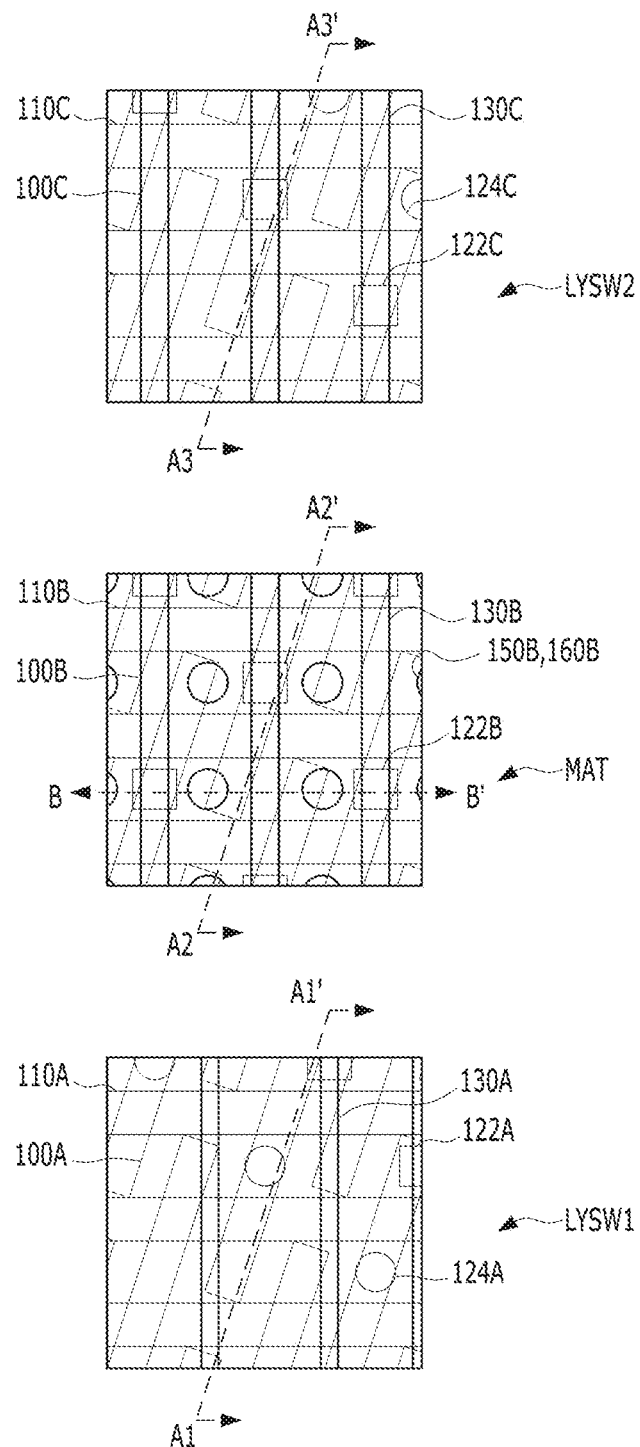
Figure 6B:
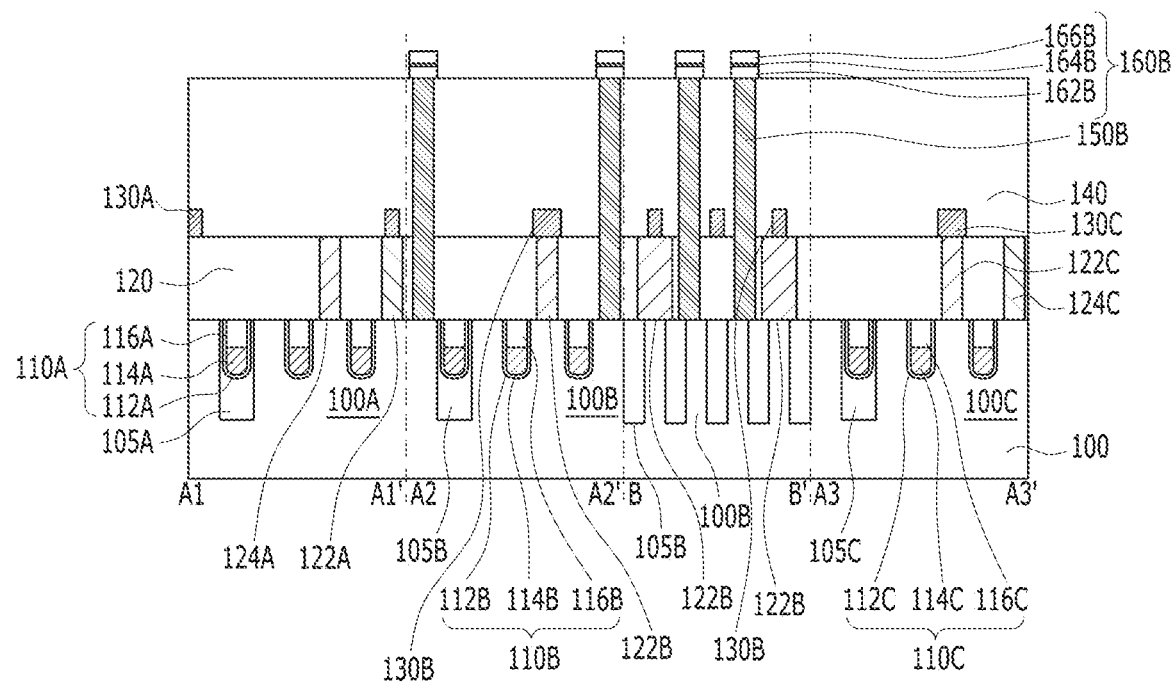

Referring to FIGS. 6A and 6B, a second interlayer insulating layer 140 may be formed over a resultant structure of FIGS. 5A and 5B.

A lower contact 150B may be formed to penetrate through the second interlayer insulating layer 140 and the first interlayer insulating layer 120 of the mat region MAT and be coupled to portions of the second active regions 100B. For reference, the lower contact 150B may be coupled to a variable resistance element under the variable resistance element, and an upper contact which will be described later may be coupled to the variable resistance element over the variable resistance element.

A plurality of the lower contacts 150B may be arranged to be coupled to the first side portions and the second side portions of the second active regions 100B, that is, the drain regions of the second active regions 100B, respectively.

The lower contacts 150B may be formed by forming a mask pattern (not shown) over the second interlayer insulating layer 140 to expose a region in which the lower contacts 150B are to be formed, etching the second interlayer insulating layer 140 and the first interlayer insulating layer 120 using the mask pattern as an etching barrier until the second active regions 100B are exposed, and filling a space formed by the etching process with a conductive material.

At this stage of the fabrication, variable resistance elements 160B may be formed to be coupled to the lower contacts 150B and to be located over the second interlayer insulating layer 140.

The variable resistance elements 160B may be coupled to the lower contacts 150B and upper contacts which will be described later and have a characteristic which switches between different resistance states according to a voltage or current supplied from the lower contacts 150B and the upper contacts. The variable resistance element 160B may include a single-layered structure or multi-layered structure that includes materials used in an RRAM, a PRAM, an MRAM, an FRAM, etc. For example, the variable resistance element 160B may include a metal oxide such as a transition metal oxide, a perovskite-based material and the like, a phase change material such as a chalcogenide-based material and the like, a ferroelectric material, or a ferromagnetic material. The variable resistance element 160B may store different data according to its resistance state. For example, when the variable resistance element 160B is in a low resistance state, data '1' may be stored. Also, when the variable resistance element 160B is in a high resistance state, data '0' may be stored.

In the present implementation, the variable resistance element 160B may include an MTJ (Magnetic Tunnel Junction) structure which includes a first ferromagnetic layer 162B, a second ferromagnetic layer 166B formed over the first ferromagnetic layer 162B, and a tunnel barrier layer 164B interposed therebetween. One of the first and second ferromagnetic layers 162B and 166B may serve as a pinned layer having a pinned magnetization direction, and the other of the first and second ferromagnetic layers 162B and 166B may serve as a free layer having a variable magnetization direction. The first and second ferromagnetic layers 162B and 166B may have a single-layered structure or multi-layered structure including a ferromagnetic material, for example, an Fe—Pt alloy, an Fe—Pd alloy, a Co—Pd alloy, a Co—Pt alloy, an Fe—Ni—Pt alloy, a Co—Fe—Pt alloy, a Co—Ni—Pt alloy, a Co—Fe—B alloy, and the like. The tunnel barrier layer 164B may allow tunneling of electrons when data is written in the variable resistance element 160B so that the magnetization direction of the free layer is changed. The tunnel barrier layer 164B may have a single-layered structure or multi-layered structure including an insulating oxide, for example, MgO, CaO, SrO, TiO, VO, NbO, and the like. When the magnetization direction of the free layer is parallel to that of the pinned layer by a switching current flowing through the variable resistance element 160B, the variable resistance element 160B may have a low resistance state. On the other hand, when the magnetization direction of the free layer is anti-parallel to that of the pinned layer by a switching current, the variable resistance element 160B may have a high resistance state. The variable resistance element 160B may further include one or more additional layers (not shown) in addition to the MTJ structure in order to improve characteristics of the MTJ structure.

The variable resistance element 160B may be formed by sequentially depositing material layers for forming the variable resistance element 160B, for example, a ferromagnetic material layer—an insulating material layer—a ferromagnetic material layer, and selectively etching the material layers.

Figure 7A:
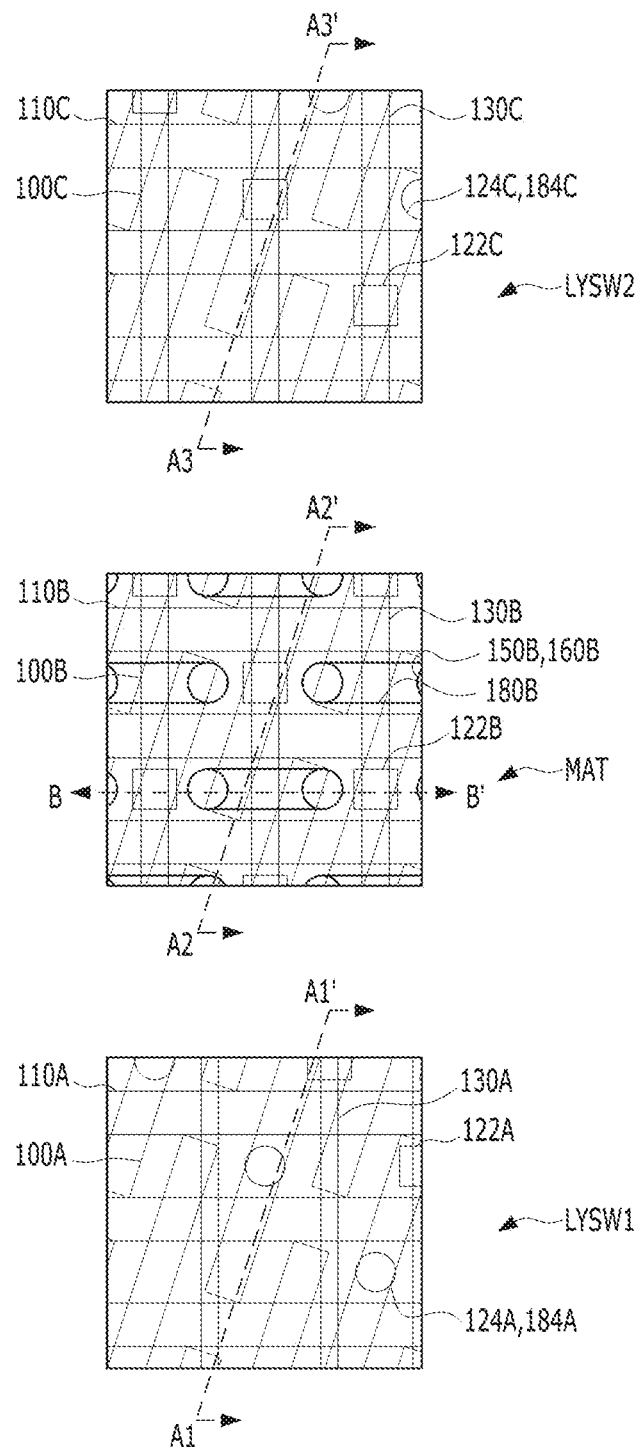
Figure 7B:
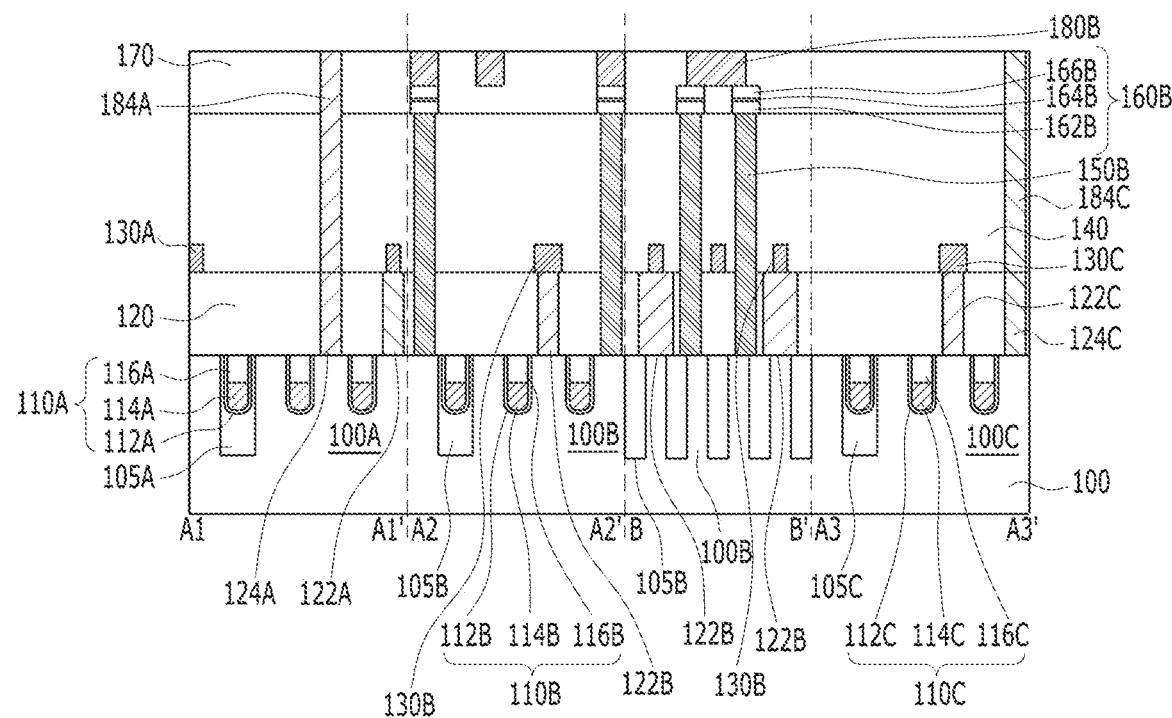

Referring to FIGS. 7A and 7B, a third interlayer insulating layer 170 may be formed over a resultant structure of FIGS. 6A and 6B.

Then, upper contacts 180B may be formed in the third interlayer insulating layer 170 of the mat region MAT to be coupled to top ends of the variable resistance elements 160B.

Each of the upper contacts 180B may be commonly coupled to a pair of the variable resistance elements 160B which are adjacent to each other in the first direction, and have a bar-shape which has a major axis in the first direction. The upper contacts 180B may be arranged so that each upper contact 180B overlaps the pair of the variable resistance elements 160B and a region therebetween while not overlapping the common source region. Therefore, the upper contacts 180B may be arranged in a zigzag type in the second direction.

The upper contacts 180B may be formed by forming a mask pattern (not shown) over the third interlayer insulating layer 170 to expose a region in which the upper contacts 180B are to be formed, etching the third interlayer insulating layer 170 using the mask pattern as an etching barrier until top surfaces of the variable resistance elements 160B are exposed, and filling a space formed by the etching process with a conductive material.

Before forming the upper contacts 180B, additional upper contacts (not shown) coupled to the variable resistance elements 160B, respectively, may be formed over the variable resistance elements 160B in order to secure a process margin. In this case, the upper contacts 180B are not in a direct contact with the top ends of the variable resistance elements 160B. That is, the upper contacts 180B may be indirectly coupled to the variable resistance elements 160B through the additional upper contacts.

Next, first upper bit line contacts 184A may be formed to penetrate through the third interlayer insulating layer 170 and the second interlayer insulating layer 140 of the first switching region LYSW1 and be coupled to the first lower bit line contacts 124A, respectively, and third upper bit line contacts 184C may be formed to penetrate through the third interlayer insulating layer 170 and the second interlayer insulating layer 140 of the second switching region LYSW2 and be coupled to the third lower bit line contacts 124C, respectively.

The first upper bit line contacts 184A and the third upper bit line contacts 184C may be formed by forming a mask pattern (not shown) over the third interlayer insulating layer 170 to expose a region in which these contacts are to be formed, etching the third interlayer insulating layer 170 and the second interlayer insulating layer 140 using the mask pattern as an etching barrier until top surfaces of the first lower bit line contacts 124A and the third lower bit line contacts 124C are exposed, and filling a space formed by the etching process with a conductive material.

In the present implementation, a case that a forming process of the upper contacts 180B is performed prior to a forming process of the first upper bit line contacts 184A and the third upper bit line contacts 184C has been illustrated. However, the forming process of the first upper bit line contacts 184A and the third upper bit line contacts 184C may be performed prior to the forming process of the upper contacts 180B. Alternatively, the forming process of the first upper bit line contacts 184A and the third upper bit line contacts 184C and the forming process of the upper contacts 180B may be performed at the same time, that is, using a single masking and etching process.

Figure 8A:
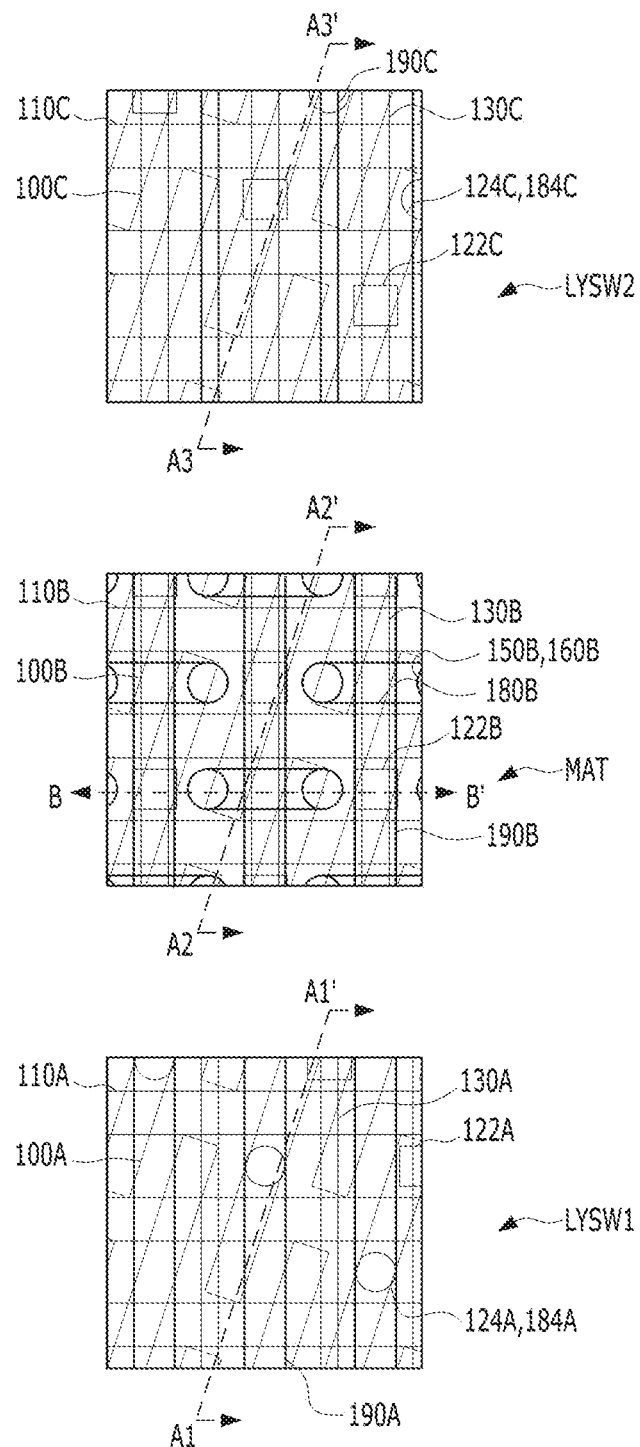
Figure 8B:
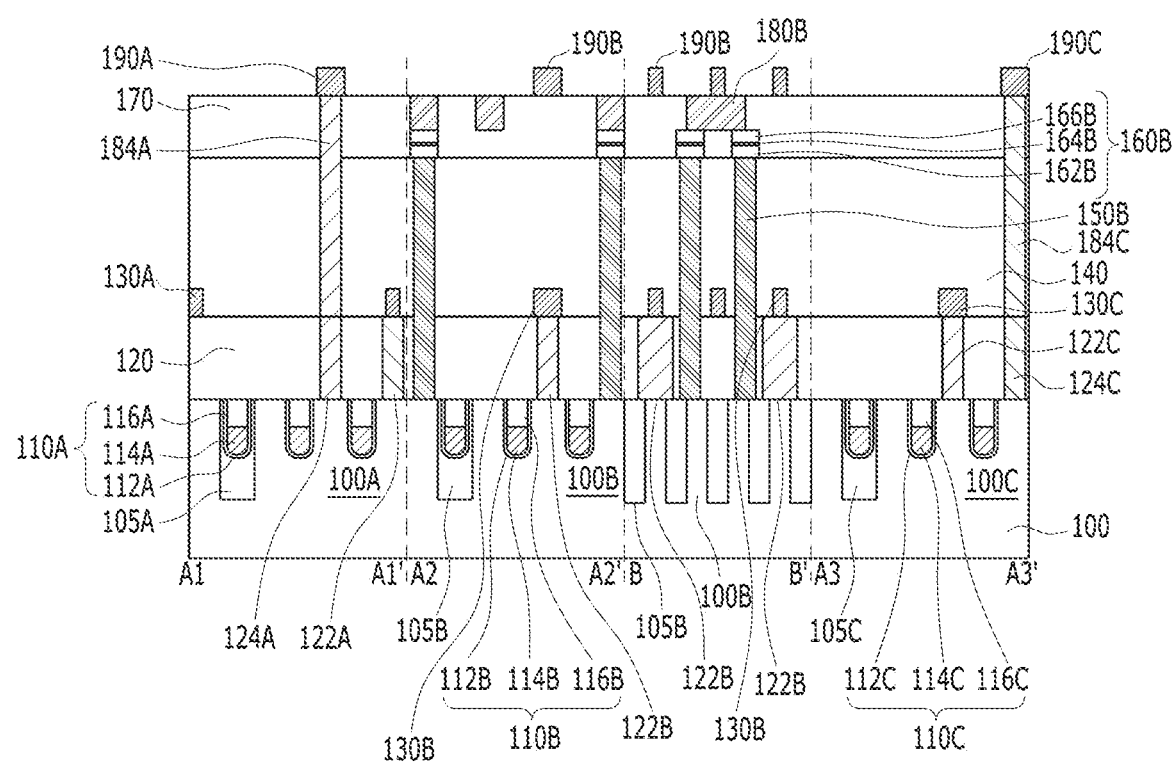

Referring to FIGS. 8A and 8B, a first bit line 190A coupled to the first upper bit line contact 184A of the first switching region LYSW1, a second bit line 190B coupled to the upper contact 180B of the mat region MAT, and a third bit line 190C coupled to the third upper bit line contact 184C of the second switching region LYSW2 may be formed over a resultant structure of FIGS. 7A and 7B.

Each of a plurality of the first bit lines 190A may overlap a corresponding one of the first upper bit line contacts 184A and extend in the second direction. Each of a plurality of the third bit lines 190C may overlap a corresponding one of the third upper bit line contacts 184C and extend in the second direction. Each of a plurality of the second bit lines 190B may extend in the second direction and overlap the upper contacts 180B which are arranged in a row in the second direction. Furthermore, the second bit line 190B may be located to overlap a center of the upper contact 180B in the first direction in order to secure a process margin, for example, to secure a distance between the second bit lines 190B. In this case, the second bit lines 190B may overlap the second source lines 130B, respectively. A width of the second bit line 190B may be the same as or similar to a width of the second source line 130B.

The first to third bit lines 190A, 190B and 190C may be formed by depositing a conductive material over the resultant structure of FIGS. 7A and 7B and selectively etching the conductive material. Alternatively, the first to third bit lines 190A, 190B and 190C may be formed by depositing an insulating material over the resultant structure of FIGS. 7A and 7B, selectively etching the insulating material to provide a space in which the first to third bit lines 190A, 190B and 190C are to be formed, and filling the space with a conductive material. Here, the first bit line 190A and the second bit line 190B may be electrically connected with each other, and the second bit line 190B and the third bit line 190C may be electrically separated from each other. For this, the conductive material or insulating material for forming the first bit line 190A and the second bit line 190B may be patterned at one time. That is, the first bit line 190A and the second bit line 190B may extend between the first switching region LYSW1 and the mat region MAT to be in a direct contact with each other. In the first direction, the first bit line 190A and the second bit line 190B may be formed to have substantially the same width at substantially the same position. On the other hand, the second bit line 190B and the third bit line 190C may be cut between the mat region MAT and the second switching region LYSW2. In the first direction, the second bit line 190B and the third bit line 190C may be formed at different positions and need not to have the same width.

By the aforementioned processes, the semiconductor memory of FIGS. 8A and 8B may be formed.

Referring again to FIGS. 8A and 8B, the first to third active regions 100A, 100B and 100C and the first to third gate structures 110A, 110B and 110C which have substantially the same shapes and arrangements may be formed in the first switching region LYSW1, the mat region MAT and the second switching region LYSW2.

The common source region of the second active region 100B of the mat region MAT, which is formed between the pair of the second gate structures 110B, may be coupled to the second source line 130B extending in the second direction through the second source line contact 122B located over the common source region. On the other hand, the drain regions of the second active region 100B of the mat region MAT, which are formed at both sides of the pair of the second gate structures 110B, may be coupled to the second bit line 190B extending in the second direction through a stack structure of the lower contact 150B and the variable resistance element 160B located over each drain region, and the upper contact 180B located over the stack structure and overlapping the pair of the variable resistance elements 160B which are adjacent to each other in the first direction and a region therebetween while not overlapping the common source region.

In the first switching region LYSW1, the source region located at one side of the selected first gate structure 110A which crosses each first active region row may be coupled to the first source line 130A extending in the second direction through the first source line contact 122A. On the other hand, the drain region located at the other side of the selected first gate structure 110A which crosses each first active region row may be coupled to the first bit line 190A extending in the second direction through a stack structure of the first lower bit line contact 124A and the first upper bit line contact 184A.

In the second switching region LYSW2, the source region located at one side of the selected third gate structure 110C which crosses each third active region row may be coupled to the third source line 130C extending in the second direction through the third source line contact 124C. On the other hand, the drain region located at the other side of the selected third gate structure 110C which crosses each third active region row may be coupled to the third bit line 190C extending in the second direction through a stack structure of the third lower bit line contact 124C and the third upper bit line contact 184C.

The first bit line 190A of the first switching region LYSW1 and the second bit line 190B of the mat region MAT may be electrically connected with each other, and the first source line 130A of the first switching region LYSW1 and the second source line 130B of the mat region MAT may be electrically blocked from each other. The third bit line 190C of the second switching region LYSW2 and the second bit line 190B of the mat region MAT may be electrically blocked from each other, and the third source line 130C of the second switching region LYSW2 and the second source line 130B of the mat region MAT may be electrically connected with each other.

In the above semiconductor memory, during an operation for writing a data in the variable resistance element 160B or reading a data stored in the variable resistance element 160B, a current flow (a data flow) passing the first switching region LYSW1, the mat region MAT and the second switching region LYSW2 may be formed. This will be described with reference to FIGS. 9A and 9B.

Figure 9A:
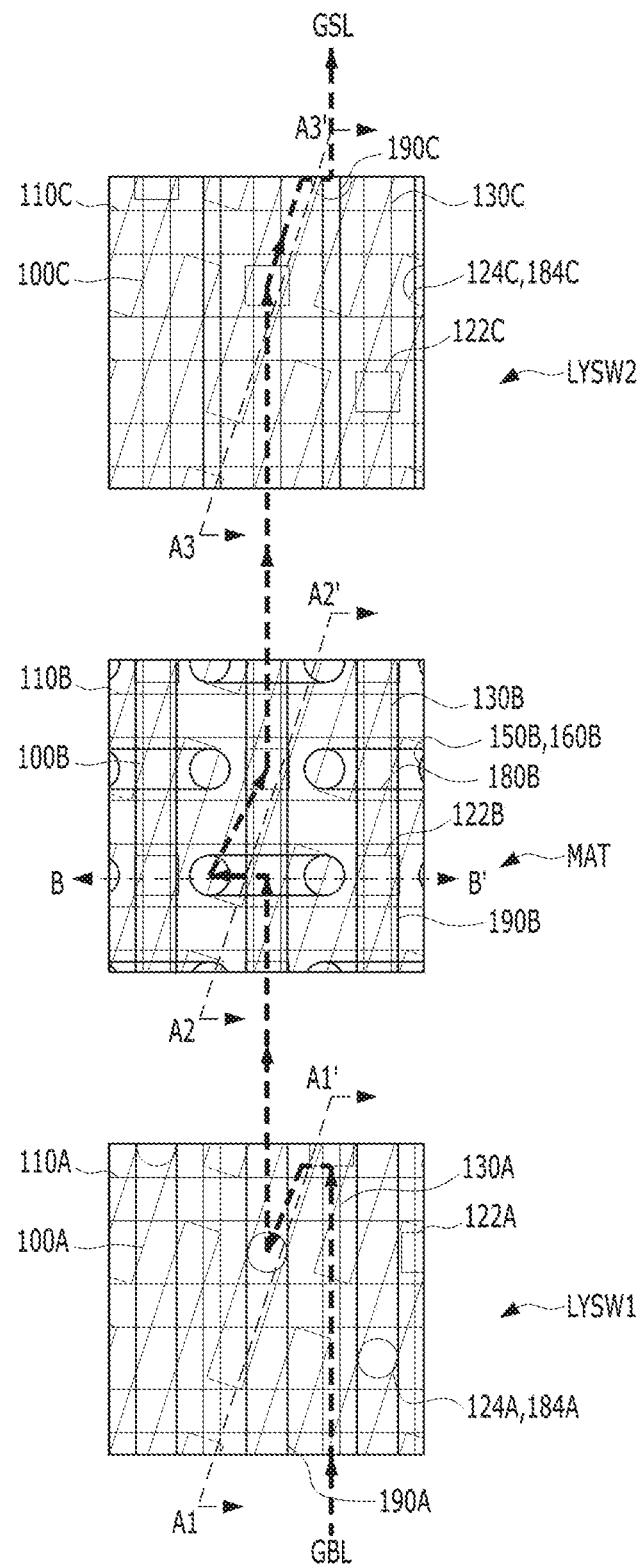
FIGS. 9A and 9B are diagrams illustrating a current flow in the semiconductor memory of FIGS. 8A and 8B.
Figure 9B:
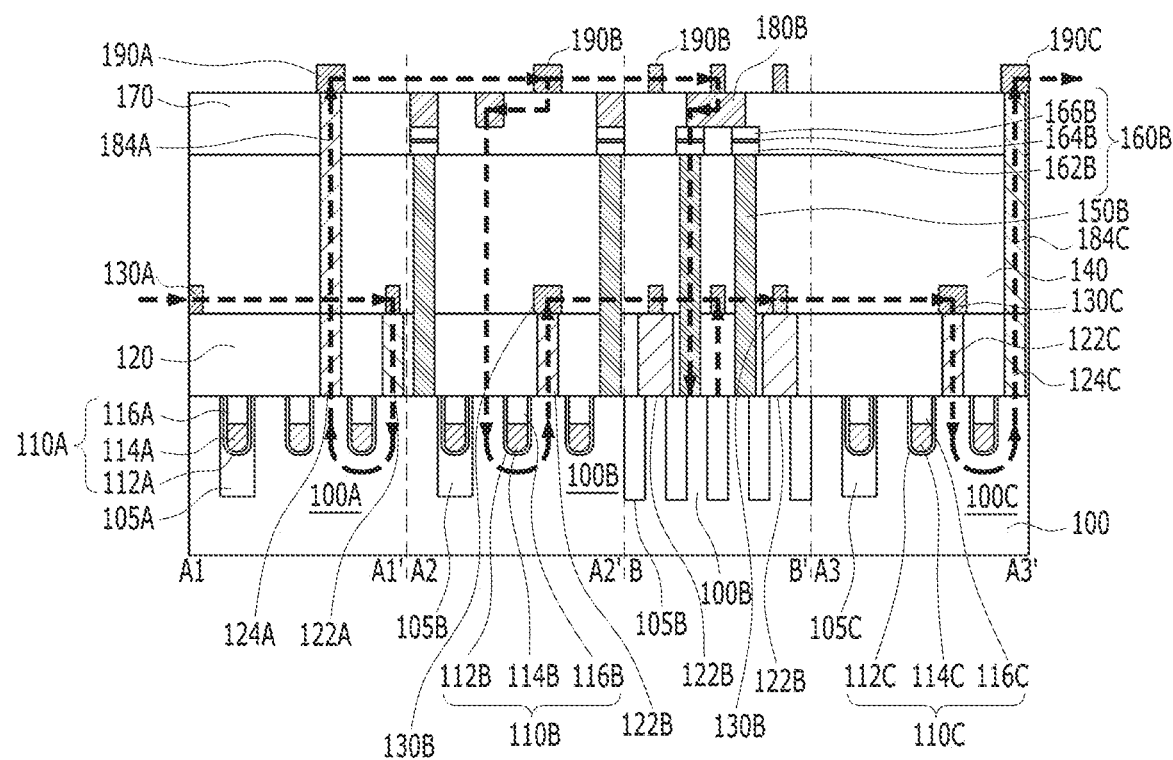

FIGS. 9A and 9B are diagrams illustrating a current flow in the semiconductor memory of FIGS. 8A and 8B. For example, a case that the first source lines 130A of the first switching region LYSW1 are coupled to a global bit line GBL and the third bit lines 190C of the second switching region LYSW2 are coupled to a global source line GSL is illustrated.

Referring to FIGS. 9A and 9B, an example of a current flow during an operation for writing a data in a certain variable resistance element 160B or reading a data stored in the certain variable resistance element 160B is indicated by an arrow. For convenience of explanation, it is assumed that the certain variable resistance element 160B corresponds to the third one from the top and the second one from the left of the variable resistance elements 160B.

Specifically, a current input from the global bit line GBL may pass the first source lines 130A and move to the first source line contacts 122A. When a turn-on voltage of a transistor is applied to the first gate electrode 114A of a certain first gate structure 110A of the first gate structures 110A—wherein the certain first gate structure 110A corresponds to the first one from the top of the first gate structures 110A—, the current may flow from the first source line contacts 122A, via a channel under the certain first gate structure 110A, to the first lower bit line contact 124A located at one side of the certain first gate structure 110A. The current input to the first lower bit line contact 124A may be output from the first switching region LYSW1 through the first upper bit line contact 184A and the first bit line 190A coupled to the first lower bit line contact 124A.

As described above, since the first bit line 190A of the first switching region LYSW1 and the second bit line 190B of the mat region MAT are electrically connected with each other, the current may be input to the second bit line 190B of the mat region MAT. The current input to the second bit line 190B may move to the lower contact 150B via the upper contact 180B and the certain variable resistance element 160B. When a turn-on voltage of a transistor is applied to the second gate electrode 114B of a certain second gate structure 110B of the second gate structures 110B—wherein the certain second gate structure 110B corresponds to the second one from the top of the second gate structures 110B—, the current may flow from the lower contact 150B, via a channel under the certain second gate structure 110B, to the second source line contact 122B located at one side of the certain second gate structure 110B. The current input to the second source line contact 122B may be output from the mat region MAT through the second source line 130B coupled to the second source line contact 122B.

As described above, since the third source line 130C of the second switching region LYSW2 and the second source line 130B of the mat region MAT are electrically connected with each other, the current may be input to the third source line 130C of the second switching region LYSW2. The current input to the third source line 130C may move to the third source line contact 122C. When a turn-on voltage of a transistor is applied to the third gate electrode 114C of a certain third gate structure 110C of the third gate structures 110C—wherein the certain second gate structure 110C corresponds to the first one from the top of the third gate structures 110C—, the current may flow from the third source line contact 122C, via a channel under the certain third gate structure 110C, to the third lower bit line contact 124C located at one side of the certain third gate structure 110C. The current input to the third lower bit line contact 124C may be output to the global source line GSL through the third upper bit line contact 184C and the third bit line 190C coupled to the third lower bit line contact 124C.

In the present implementation, a case that the current flows in a direction from the global bit line GBL to the global source line GSL is illustrated. However, the current may flow in an opposite direction. That is, a direction of the arrow shown in FIGS. 9A and 9B may be reversed. Also, in the present implementation, the first switching region LYSW1 is connected with the global bit line GBL and the second switching region LYSW2 is connected with the global source line GSL. However, in other implementations, the first switching region LYSW1 may be connected with the global source line GSL and the second switching region LYSW2 may be connected with the global bit line GBL. Also, positions of the first switching region LYSW1 and the second switching region LYSW2 may be reversed with each other. Therefore, a current flow can be generated or provided to sequentially pass the first source line 130A—the first source line contact 122A—the first transistor TR1 of which a gate is coupled to the first gate structure 110A—the first bit line contact 124A and 184A—the first bit line 190A—the second bit line 190B—the upper contact 180B—the variable resistance element 160B—the lower contact 150B—the second transistor TR2 of which a gate is coupled to the second gate structure 110B—the second source line contact 122B—the second source line 130B—the third source line 130C—the third source line contact 122C—the third transistor TR3 of which a gate is coupled to the third gate structure 110C—the third bit line contact 124C and 184C—the third bit line 190C in a forward direction or reverse direction.

Figure 10A:
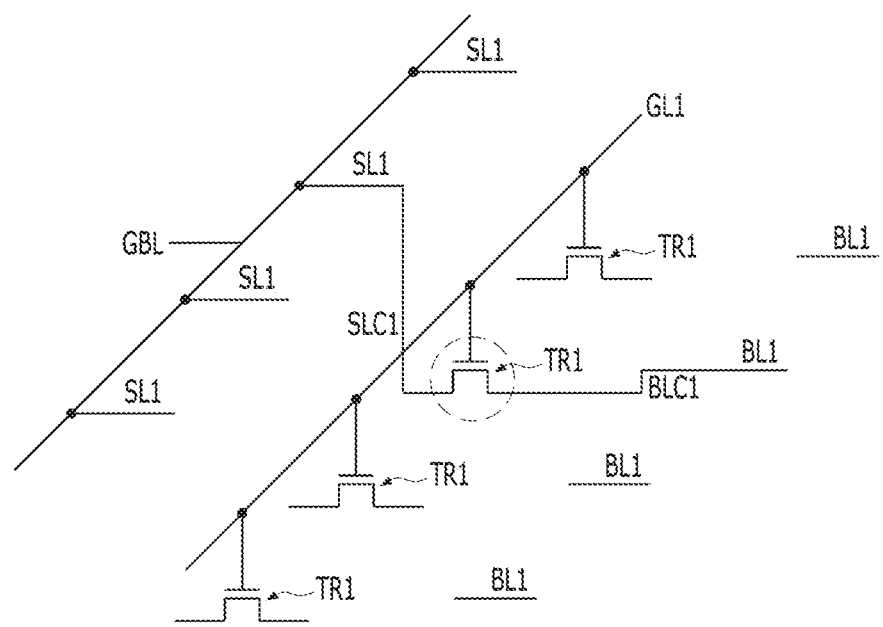
FIG. 10A is a diagram illustrating an equivalent circuit of the first switching region of FIGS. 8A and 8B.
Figure 10B:
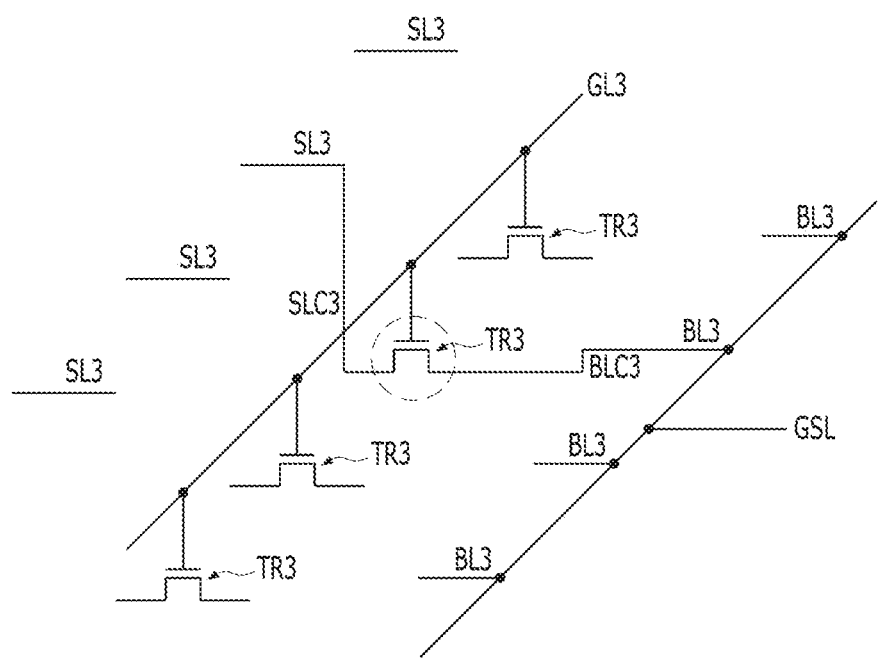
FIG. 10B is a diagram illustrating an equivalent circuit of the second switching region of FIGS. 8A and 8B.

FIG. 10A is a diagram illustrating an equivalent circuit of the first switching region of FIGS. 8A and 8B, and FIG. 10B is a diagram illustrating an equivalent circuit of the second switching region of FIGS. 8A and 8B.

Referring to FIG. 10A, gates of a plurality of first transistors TR1 may be coupled to a first gate line GL1. Here, the first gate line GL1 may correspond to a certain one of the first gate structures 110A of FIGS. 8A and 8B, thereby extending in the first direction. The plurality of first transistors TR1 may be arranged in the first direction along the first gate line GL1. The plurality of first transistors TR1 may include the certain one of the first gate structures 110A, and source regions and drain regions formed in the first active regions 100A which are arranged in the first direction to overlap the certain one of the first gate structures 110A and located at both sides of the certain one of the first gate structures 110A.

A source region and a drain region of only one (see a dotted circle) of the first transistors TR1 arranged in the first direction may be coupled to a corresponding first source line SL1 through a first source line contact SLC1 and a corresponding first bit line BL1 through a first bit line contact BLC1. Source regions and drain regions of remaining first transistors TR1 may not be coupled to the first source line contact SLC1 and the first bit line contact BLC1 at the same time. This is because, as shown in FIGS. 8A and 8B, the first source line contact 122A and the first bit line contact 124A and 184A are located over only one of the first active regions 100A which are arranged in the first direction and overlap only one of the first gate structures 110A.

A plurality of first source lines SL1 may be commonly coupled to a global bit line GBL.

A plurality of first bit lines BL1 may be coupled to bit lines of a mat region (not shown), respectively.

Referring to FIG. 10B, gates of a plurality of third transistors TR3 may be coupled to a third gate line GL3. Here, the third gate line GL3 may correspond to a certain one of the third gate structures 110C of FIGS. 8A and 8B, thereby extending in the first direction. The plurality of third transistors TR3 may be arranged in the first direction along the third gate line GL3. The plurality of third transistors TR3 may include the certain one of the third gate structures 110C, and source regions and drain regions formed in the third active regions 100C which are arranged in the first direction to overlap the certain one of the third gate structures 110C and located at both sides of the certain one of the third gate structures 110C.

A source region and a drain region of only one (see a dotted circle) of the third transistors TR3 arranged in the first direction may be coupled to a corresponding third source line SL3 through a third source line contact SLC3 and a corresponding third bit line BL3 through a third bit line contact BLC3. Source regions and drain regions of remaining third transistors TR3 may not be coupled to the third source line contact SLC3 and the third bit line contact BLC3 at the same time. This is because, as shown in FIGS. 8A and 8B, the third source line contact 122C and the third bit line contact 124C and 184C are located over only one of the third active regions 100C which are arranged in the first direction and overlap only one of the third gate structures 110C.

A plurality of third source lines SL3 may be coupled to source lines of a mat region (not shown), respectively.

A plurality of third bit lines BL3 may be commonly coupled to a global source line GSL.

Figure 11A:
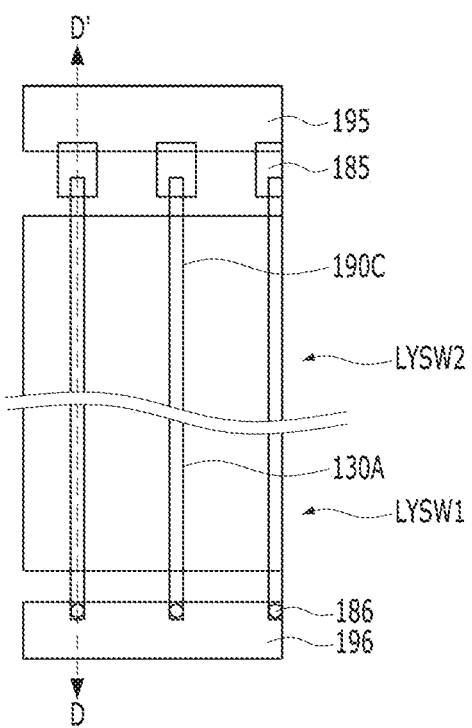
FIGS. 11A and 11B are a planar diagram and a cross-sectional diagram which show a connection between the first switching region and the global bit line and between the second switching region and the global source line of FIGS. 8A and 8B in more detail.
Figure 11B:
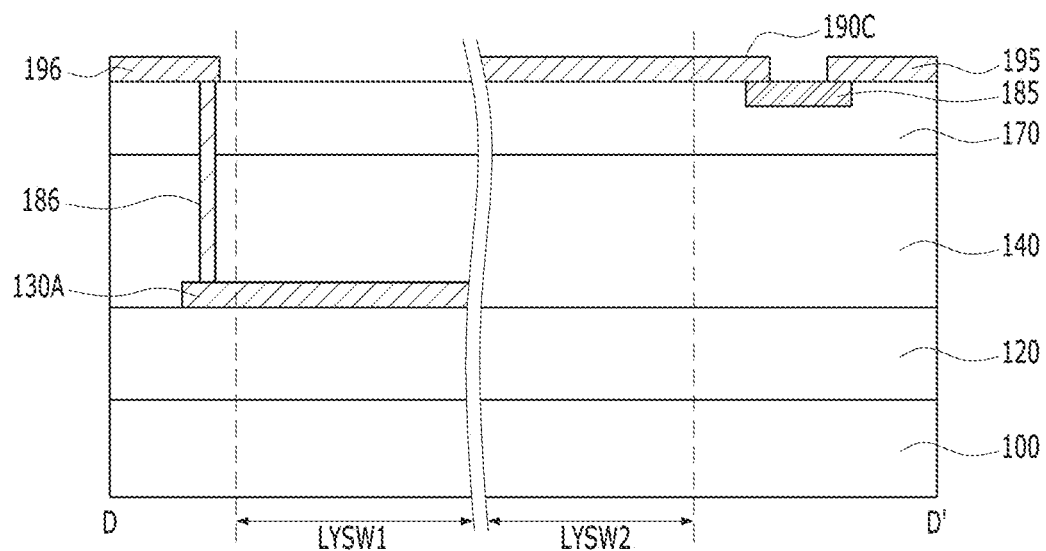

FIGS. 11A and 11B are a planar diagram and a cross-sectional diagram which show a connection between the first switching region and the global bit line and between the second switching region and the global source line of FIGS. 8A and 8B in more detail. For convenience of explanation, necessary components are illustrated.

Referring to FIGS. 11A and 11B, the first source lines 130A of the first switching region LYSW1 may further extend to an outside of the first switching region LYSW1, for example, to a certain peripheral circuit region.

Global bit line contacts 186 may be formed over end portions of the first source lines 130A which are located at the outside of the first switching region LYSW1, respectively. The global bit line contacts 186 may penetrate through the second and third interlayer insulating layers 140 and 170 and be coupled to the end portions of the first source lines 130A, respectively. The global bit line contacts 186 may be formed together with the first upper bit line contacts 184A of the first switching region LYSW1 and/or the third upper bit line contacts 184C of the second switching region LYSW2. That is, the global bit line contacts 186 and the first upper bit line contacts 184A and/or the third upper bit line contacts 184C may be located at the same level in a vertical direction, and formed of the same material.

A global bit line 196 may be formed over the third interlayer insulating layer 170 to be commonly coupled to the global bit line contacts 186. The global bit line 196 may be formed together with the first to third bit lines 190A, 190B and 190C. That is, the global bit line 196 and the first to third bit lines 190A, 190B and 190C may be located at the same level in a vertical direction, and formed of the same material.

Also, the third bit lines 190C of the second switching region LYSW2 may further extend to an outside of the second switching region LYSW2.

Global source line contacts 185 may be formed under end portions of the third bit lines 190C which are located at the outside of the second switching region LYSW2, respectively. The global source line contacts 185 may be coupled to the end portions of the third bit lines 190C, respectively, within the third interlayer insulating layer 170. The global source line contacts 185 may be formed together with the upper contacts 180B of the mat region MAT. That is, the global source line contacts 185 and the upper contacts 180B may be located at the same level in a vertical direction, and formed of the same material.

A global source line 195 may be formed over the third interlayer insulating layer 170 to be commonly coupled to the global source line contacts 185. The global source line 195 may be formed together with the first to third bit lines 190A, 190B and 190C. That is, the global source line 195 and the first to third bit lines 190A, 190B and 190C may be located at the same level in a vertical direction, and formed of the same material.

Since the global source line 195, the global bit line 196, and components coupling the global source line 195 and the global bit line 196 to the switching regions LYSW1 and LYSW2 are formed together with components of the switching regions LYSW1 and LYSW2 and/or the mat region MAT, a cost and a degree of difficulty of processes may be reduced.

The semiconductor memory and the method of fabricating the same described above may have following advantages.

First, components of the mat region and/or the switching region may be suitably arranged to increase an area efficiency. Therefore, a degree of integration of the semiconductor memory may be increased.

Furthermore, the transistor of the mat region and the transistor of the switching region may be formed to have the same structure, so a degree of difficulty of processes may be reduced. Specially, when the transistor of the mat region and the transistor of the switching region are formed to have the same buried gate structure, the mat region and the switching region may share a well formed within the substrate. That is, the mat region and the switching region may be provided in the same well. Therefore, an area can be further reduced as compared with a case where the mat region and the switching region are provided in different wells as in a known art. Furthermore, when a plurality of the mat regions and a plurality of the switching regions are alternately arranged in the second direction as shown in FIG. 2, all the mat regions and the switching regions can be provided in the same well (refer to B of FIG. 2).

Furthermore, most of components of the switching region may be formed together with components of the mat region. Accordingly, the processes can be simplified, and the process cost can be reduced.

Furthermore, when the transistors of the mat region and the switching region have the buried gate structure, resistance of the transistors may be reduced. Specially, when the transistors of the mat region and the switching region have a so-called pin-type structure in which the active region is more protruded than the isolation layer, the resistance of the transistors may be further reduced. If the resistance of the transistor are reduced, a driving ability of the transistors may be improved and the effect of additional resistance on the variable resistance element may be reduced so that an on/off ratio of the variable resistance element increases.

In implementations, the cross-sectional shape of the semiconductor memory of the above implementation may be changed by variations of fabricating processes while the arrangements of components are maintained in the plan view.

In one implementation, contacts may have a multi-layered structure in which a plurality of layers are stacked or a single-layered structure according to fabricating methods. For example, in the above implementation, the first bit line contact 124A and 184A has a double-layered structure in which two layers of the first lower bit line contact 124A and the first upper bit line contact 184A are stacked. This is because the forming process of the first lower bit line contact 124A is performed together with the forming process of the first to third source line contacts 122A, 122B and 122C. However, in another implementation, a first bit line contact may be a single layer penetrating through the first to third interlayer insulating layers 120, 140 and 170 while maintaining its position in a plan view. Alternatively, in another implementation, a first bit line contact may have three layers penetrating through the first to third interlayer insulating layers 120, 140 and 170, respectively. Also, in the above implementation, the lower contact 150B is a single layer penetrating through the first and second interlayer insulating layers 120 and 140. However, in another implementation, a lower contact may have two layers penetrating through the first and second interlayer insulating layers 120 and 140, respectively. In this case, a portion of the lower contact which penetrates through the first interlayer insulating layer 120 may be formed together with the forming process of the first to third source line contacts 122A, 122B and 122C.

In another implementation, the height of components may be changed in a cross-sectional view. For example, in the above implementation, the first to third source lines 130A, 130B and 130C are formed prior to the forming process of the variable resistance elements 160B to be located under the variable resistance elements 160B. However, in another implementation, variable resistance elements may be formed before first to third source lines are formed so that the variable resistance elements are located under the first to third source lines. This is for preventing some lines which are formed prior to the forming process of the variable resistance elements from being negatively influenced by a heat treatment involved with the forming process of the variable resistance elements when the lines are formed of a material such as Cu, etc. This will be exemplarily described with reference to FIGS. 12A and 12B.

Figure 12A:
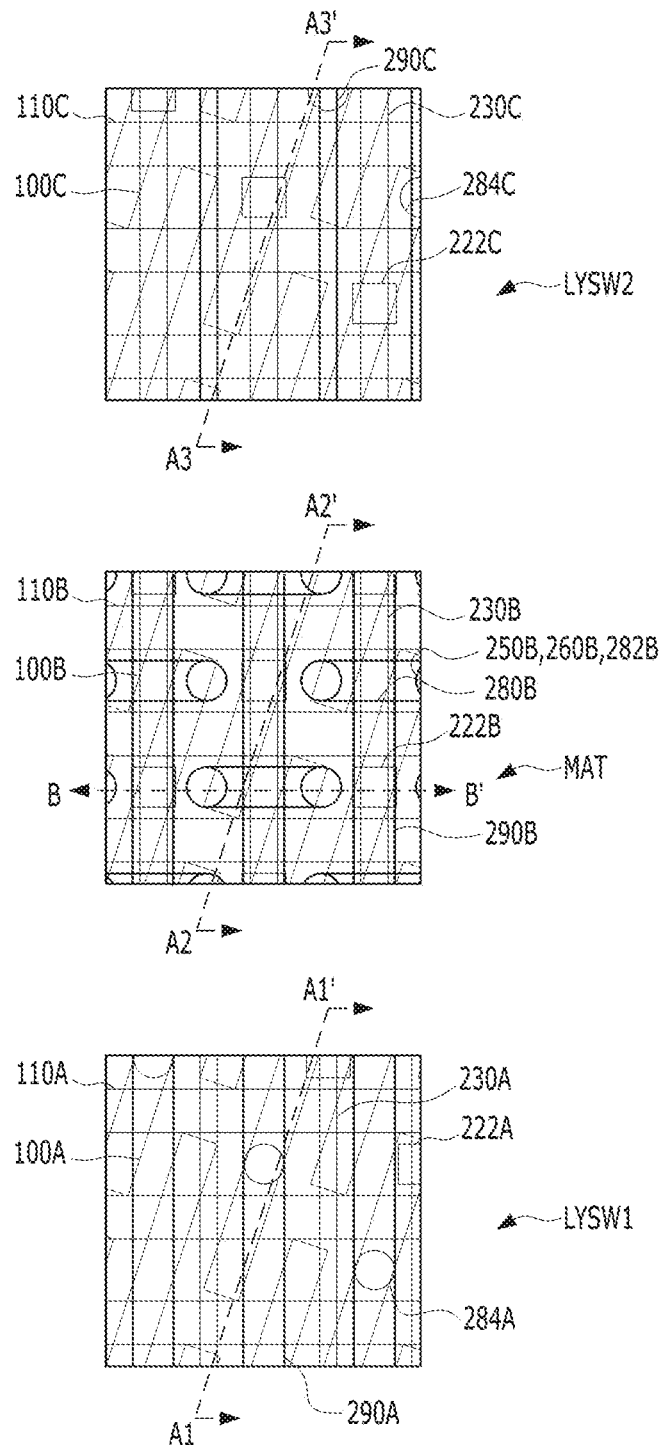
FIGS. 12A and 12B are diagrams illustrating a semiconductor memory and a method for fabricating the same in accordance with another implementation.
Figure 12B:
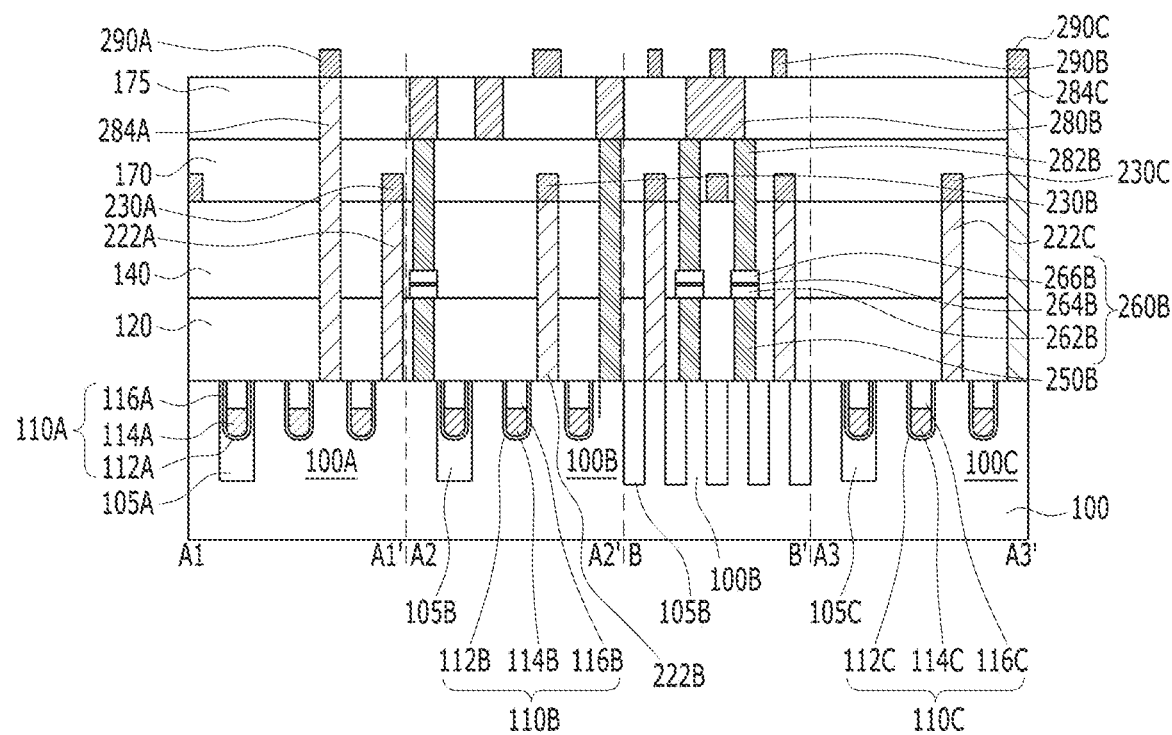

FIGS. 12A and 12B are diagrams illustrating a semiconductor memory and a method for fabricating the same in accordance with another implementation. FIG. 12A shows a plan view, and FIG. 12B shows a cross-sectional view taken along a line A1-A1', a line A2-A2', a line B-B' and a line A3-A3' of FIG. 12A. A detailed description of parts that are substantially the same as those of the aforementioned implementation of FIGS. 3A to 8B will be omitted. Specially, since arrangements of components of the present implementation may be substantially the same as those of the aforementioned implementation in a plan view, a detailed description thereof will be omitted.

First, a fabrication method is described below.

Referring to FIGS. 12A and 12B, a plurality of first active regions 100A may be defined by forming a first isolation layer 105A in a substrate 100 of a first switching region LYSW1, a plurality of second active regions 100B may be defined by forming a second isolation layer 105B in the substrate 100 of a mat region MAT, and a plurality of third active regions 100C may be defined by forming a third isolation layer 105C in the substrate 100 of a second switching region LYSW2.

Next, first gate structures 110A may be formed in the substrate 100 of the first switching region LYSW1, second gate structures 110B may be formed in the substrate 100 of the mat region MAT, and third gate structures 110C may be formed in the substrate 100 of the second switching region LYSW2.

At this time, a first interlayer insulating layer 120 may be formed, and then, lower contacts 250B may be formed to penetrate through the first interlayer insulating layer 120 of the mat region MAT and be coupled to drain regions of the second active regions 100B, respectively.

Subsequently, variable resistance elements 260B coupled to the lower contacts 250B, respectively, may be formed over the first interlayer insulating layer 120. During forming the variable resistance elements 260B, a deposition process of one or more material layers, a patterning process of the material layers, and a heat treatment process for securing characteristics of the variable resistance elements 260B may be performed.

Next, a second interlayer insulating layer 140 may be formed to cover a resultant structure in which the variable resistance elements 260B are formed.

Then, first source line contacts 222A penetrating through the first and second interlayer insulating layers 120 and 140 of the first switching region LYSW1 and coupled to portions of the first active regions 100A, second source line contacts 222B penetrating through the first and second interlayer insulating layers 120 and 140 of the mat region MAT and coupled to portions of the second active regions 100B, and third source line contacts 222C penetrating through the first and second interlayer insulating layers 120 and 140 of the second switching region LYSW2 and coupled to portions of the third active regions 100C may be formed. Although not shown, lower portions of the first source line contacts 222A, the second source line contacts 222B and/or the third source line contacts 222C may be formed together with the lower contacts 250B.

Then, first source lines 230A coupled to the first source line contacts 222A of the first switching region LYSW1 and extending in the second direction, second source lines 230B coupled to the second source line contacts 222B of the mat region MAT and extending in the second direction, and third source lines 230C coupled to the third source line contacts 222C of the second switching region LYSW2 and extending in the second direction may be formed over the second interlayer insulating layer 140. Here, the first to third source lines 230A, 230B and 230C may be formed by depositing an insulating material over the second interlayer insulating layer 140, selectively etching the insulating material to provide a space in which the first to third source lines 230A, 230B and 230C are to be formed, and filling the space with a conductive material such as Cu, etc. Alternatively, a deposition process of a conductive material and a patterning process may be performed. In any case, since the forming process of the first to third source lines 230A, 230B and 230C is performed after the forming process of the variable resistance elements 260B, the first to third source lines 230A, 230B and 230C may not be influenced by the heat treatment involved with the forming process of the variable resistance elements 260B.

Then, a third interlayer insulating layer 170 may be formed to cover a resultant structure in which the first to third source lines 230A, 230B and 230C are formed.

Then, additional upper contacts 282B penetrating through the second and third interlayer insulating layers 140 and 170 of the mat region MAT and coupled to top surfaces of the variable resistance elements 260B, respectively, may be formed. In the aforementioned implementation, a forming process of additional upper contacts may be optional. However, in the present implementation, since the first to third source lines 230A, 230B and 230C are located over the variable resistance elements 260B, it may be necessary to form the additional upper contacts 282B which have top surfaces higher than top surfaces of the first to third source lines 230A, 230B and 230C in order to connect a pair of the variable resistance elements 260B over the first to third source lines 230A, 230B and 230C.

Then, a fourth interlayer insulating layer 175 may be formed over the third interlayer insulating layer 170, and then, upper contacts 280B penetrating through the fourth interlayer insulating layer 175 of the mat region MAT may be formed. Each of the upper contacts 280B may be coupled to a pair of the additional upper contacts 282B. Also, first bit line contacts 284A penetrating through the first to fourth interlayer insulating layers 120, 140, 170 and 175 of the first switching region LYSW1 and coupled to portions of the first active regions 100A, and third bit line contacts 284C penetrating through the first to fourth interlayer insulating layers 120, 140, 170 and 175 of the second switching region LYSW2 and coupled to portions of the third active regions 100C may be formed. Although not shown, each of the first bit line contacts 284A may be formed to be divided into two or more portions in each of the forming processes of the first to fourth interlayer insulating layers 120, 140, 170 and 175. Similarly, each of the third bit line contacts 284C may be formed to be divided into two or more portions in each of the forming processes of the first to fourth interlayer insulating layers 120, 140, 170 and 175.

Then, first bit lines 290A coupled to the first bit line contacts 284A of the first switching region LYSW1 and extending in the second direction, second bit lines 290B coupled to the upper contacts 280B of the mat region MAT and extending in the second direction, and third bit lines 290C coupled to the third bit line contacts 284C of the second switching region LYSW2 and extending in the second direction may be formed over the fourth interlayer insulating layer 175.

By the aforementioned processes, the semiconductor memory of FIGS. 12A and 12B may be formed.

Referring again to FIGS. 12A and 12B, the first to third source lines 230A, 230B and 230C may be located over the variable resistance elements 260B, in a cross-sectional view. For this, height of the first to third source line contacts 222A, 222B and 222C, the lower contacts 250B and/or the upper contacts 282B and 280B may be properly adjusted. Therefore, the first to third source lines 230A, 230B and 230C may not be influenced by the heat treatment to the variable resistance elements 260B, so there may be no restriction on selection of materials for forming the first to third source lines 230A, 230B and 230C.

Meanwhile, in the semiconductor memory of the above implementations, arrangements of parts of components may be changed in a plan view. For example, as described above, relative locations of the first source line contacts 122A and the first bit line contacts 124A and 184A in the first switching region LYSW1 may be changed, or relative locations of the third source line contacts 122C and the third bit line contacts 124C and 184C in the second switching region LYSW2 may be changed. Accordingly, relative locations of the first source lines 130A and the first bit lines 190A may be changed, or relative locations of the third source lines 130C and the third bit lines 190C may be changed. This will be exemplarily described with reference to FIGS. 13A and 13B.

Figure 13A:
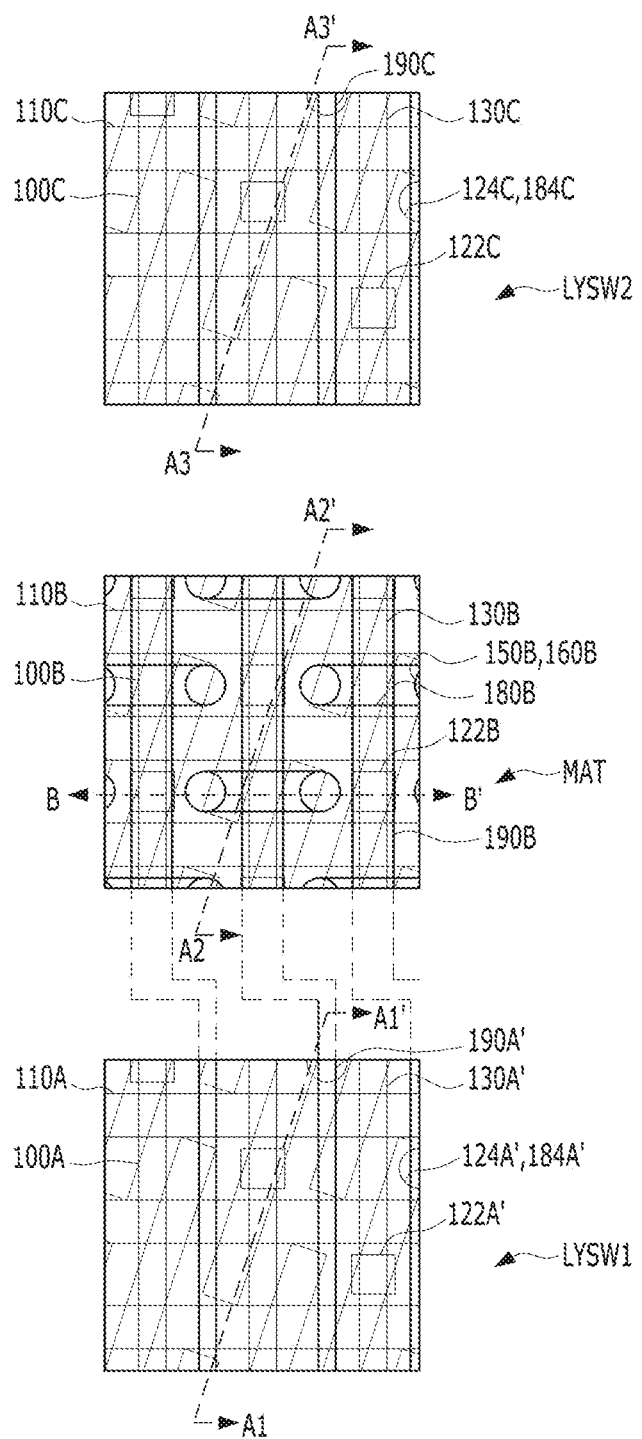
FIGS. 13A and 13B are diagrams illustrating a semiconductor memory and a method for fabricating the same in accordance with another implementation.
Figure 13B:
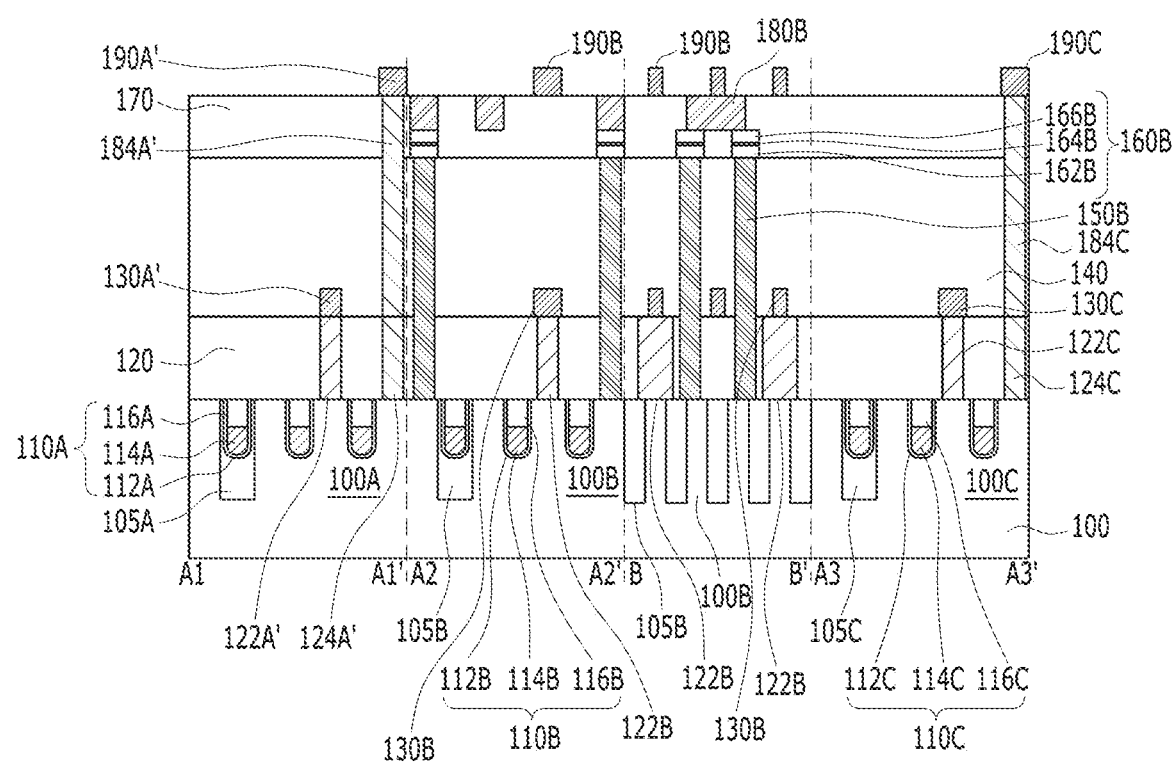

FIGS. 13A and 13B are diagrams illustrating a semiconductor memory and a method for fabricating the same in accordance with another implementation. FIG. 13A shows a plan view, and FIG. 13B shows a cross-sectional view taken along a line A1-A1', a line A2-A2', a line B-B' and a line A3-A3' of FIG. 13A. Differences from the aforementioned implementations will be mainly described.

Referring to FIGS. 13A and 13B, arrangements of components of a first switching region LYSW1 may be the same as those of a second switching region LYSW2. That is, similar to the second switching region LYSW2, first source line contacts 122A' may be located over middle portions of first active regions 100A and first bit line contacts 124A' and 184A' may be located over second side portions of the first active regions 100A in the first switching region LYSW1. Positions of the first source line contacts 122A' and the first bit line contacts 124A' and 184A' may be reversed with each other in comparison with the first switching region LYSW1 of the semiconductor memory of FIGS. 8A and 8B. Therefore, positions of first source lines 130A' and first bit lines 190A' may be reversed with each other in comparison with the first switching region LYSW1 of the semiconductor memory of FIGS. 8A and 8B. In this case, an operating method and a current flow may be substantially the same as those of the semiconductor memory of FIGS. 8A and 8B. That is, the current flow of the first switching region LYSW1 may pass the first source line 130A'—the first source line contact 122A'—a first transistor TR1 of which a gate is coupled to a first gate structure 110A—the first bit line contact 124A' and 184A'—the first bit line 190A'.

However, since the positions of the first bit lines 190A' are changed so as not to correspond to second bit lines 190B of a mat region MAT, lines having curved shapes may be provided between the first switching region LYSW1 and the mat region MAT in order to couple the first bit lines 190A' and the second bit lines 190B with each other (see dotted lines between the first switching region LYSW1 and the mat region MAT).

However, although the first source line contacts 122A' and the first bit line contacts 124A' and 184A' are arranged like this, the lines having curved shapes may not be used by adjusting the positions of the first bit lines 190A' using additional contacts. This will be exemplarily described with reference to FIGS. 14A and 14B.

Figure 14A:
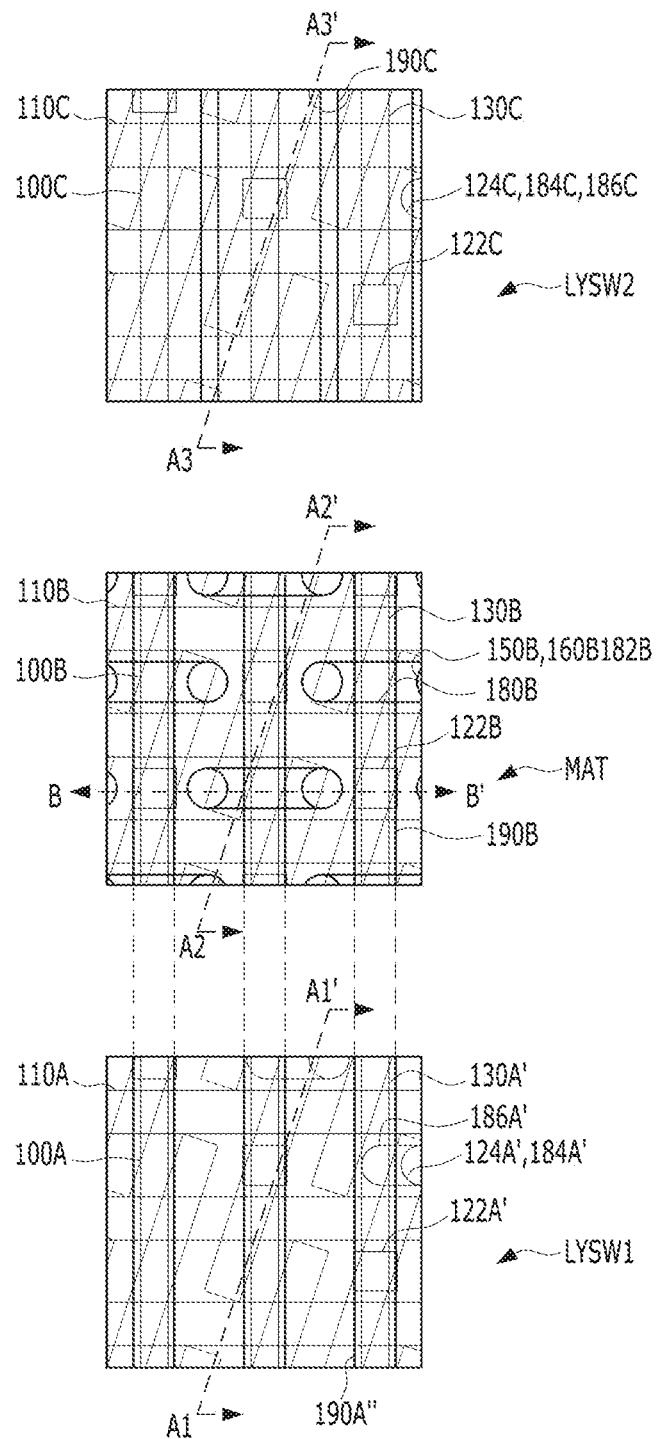
FIGS. 14A and 14B are diagrams illustrating a semiconductor memory and a method for fabricating the same in accordance with another implementation.
Figure 14B:
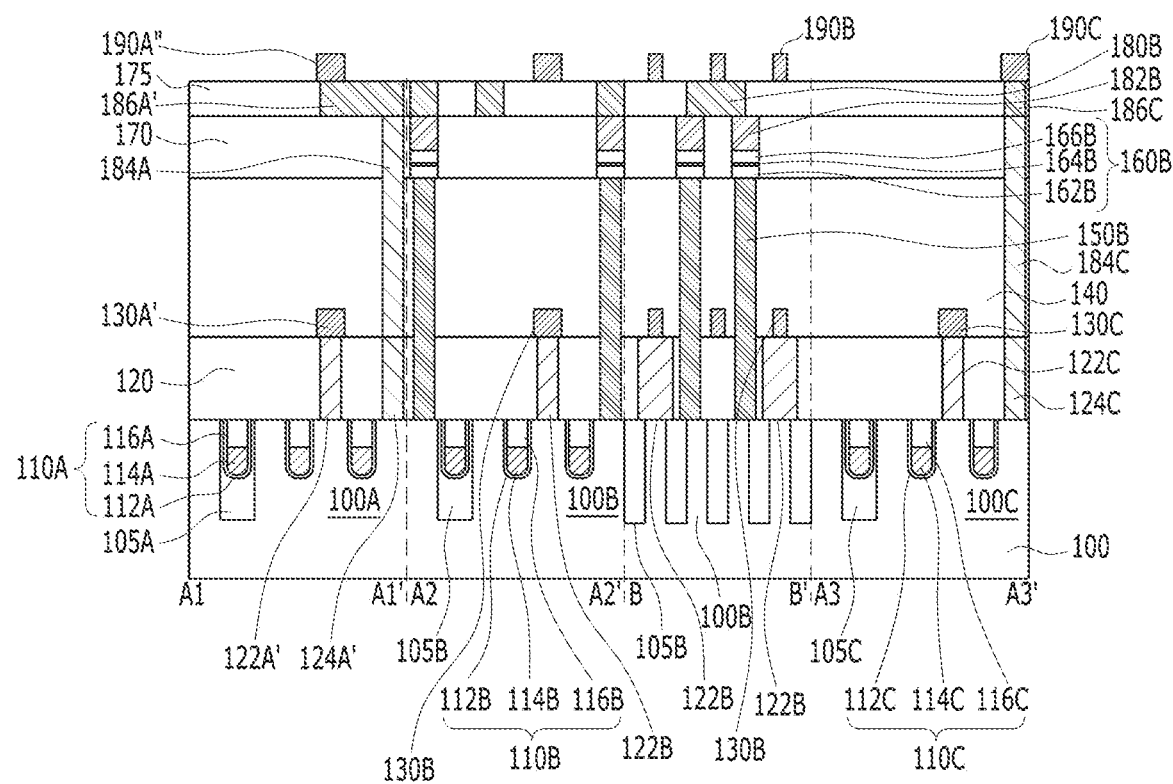

FIGS. 14A and 14B are diagrams illustrating a semiconductor memory and a method for fabricating the same in accordance with another implementation. FIG. 14A shows a plan view, and FIG. 14B shows a cross-sectional view taken along a line A1-A1', a line A2-A2', a line B-B' and a line A3-A3' of FIG. 14A. Differences from the implementation of FIGS. 13A and 13B will be mainly described.

Referring to FIGS. 14A and 14B, first source line contacts 122A' may be located over middle portions of first active regions 100A, first bit line contacts 124A' and 184A' may be located over second side portions of the first active regions 100A, and first source lines 130A' may overlap with the first source line contacts 122A' and extend in the second direction in the first switching region LYSW1, like the implementation of FIGS. 13A and 13B.

Here, additional first bit line contacts 186A' may be further formed over the first bit line contacts 124A' and 184A'. Each of the additional first bit line contacts 186A' may overlap a corresponding one of the first bit line contacts 124A' and 184A' and protrude toward a corresponding one of the first source lines 130A', which is adjacent to and located at a side of the corresponding one of the first bit line contacts 124A' and 184A', to overlap the corresponding one of the first source lines 130A'.

The first bit lines 190A" may be formed over the additional first bit line contacts 186A' to overlap the first source lines 130A' and extend in the second direction. The first bit lines 190A" may be coupled to the first bit line contacts 124A' and 184A' and the first active regions 100A via the additional first bit line contacts 186A'.

In this case, since positions of the first bit lines 190A" correspond to those of second bit lines 190B of a mat region MAT, the first bit lines 190A" and the second bit lines 190B may be coupled with each other between the first switching region LYSW1 and the mat region MAT using straight lines (see dotted lines between the first switching region LYSW1 and the mat region MAT).

In the present implementation, additional upper contacts 182B may be further formed over variable resistance elements 160B of the mat region MAT, respectively, and additional third bit line contacts 186C may be formed over third bit line contacts 124C and 184C of the second switching region LYSW2, with consideration for a height increase due to the forming of the additional first bit line contacts 186A'. The additional first bit line contacts 186A' may be formed together with the upper contacts 180B and/or the additional third bit line contacts 186C.

Meanwhile, in the aforementioned implementations, the plurality of first transistors TR1 of which gates are coupled to one first gate structure 110A of the first switching region LYSW1 have the plurality of source regions which are separated from each other and the plurality of drain regions which are separated from each other. Similarly, the plurality of third transistors TR3 of which gates are coupled to one third gate structure 110C of the second switching region LYSW2 have the plurality of source regions which are separated from each other and the plurality of drain regions which are separated from each other. However, when the plurality of the source regions are electrically coupled with each other and the plurality of the drain regions are electrically coupled with each other, the plurality of the transistors may be coupled in parallel to have reduced resistance. This will be exemplarily described with reference to FIGS. 15A and 16B.

Figure 15A:
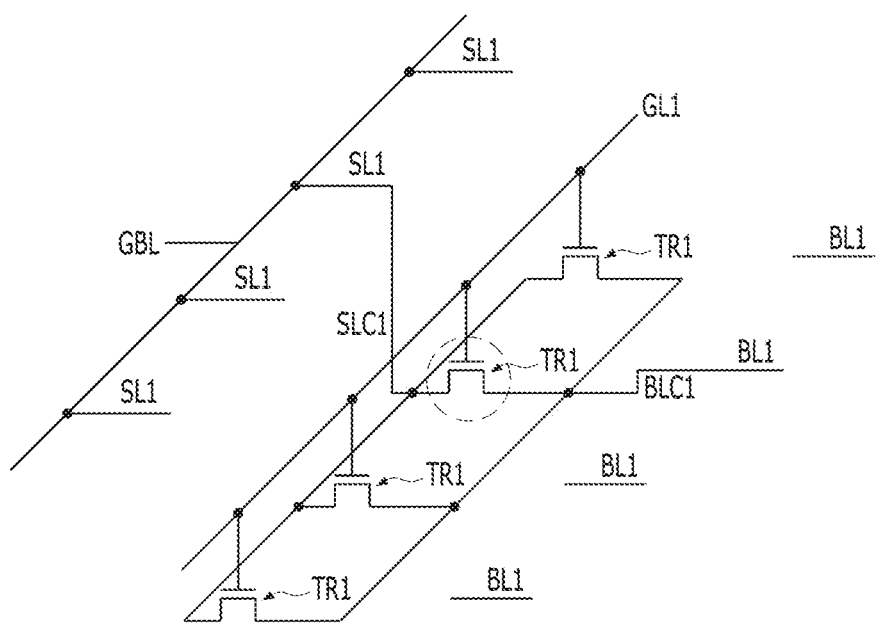
FIG. 15A is a diagram illustrating an equivalent circuit of a first switching region of a semiconductor memory in accordance with another implementation.
Figure 15B:
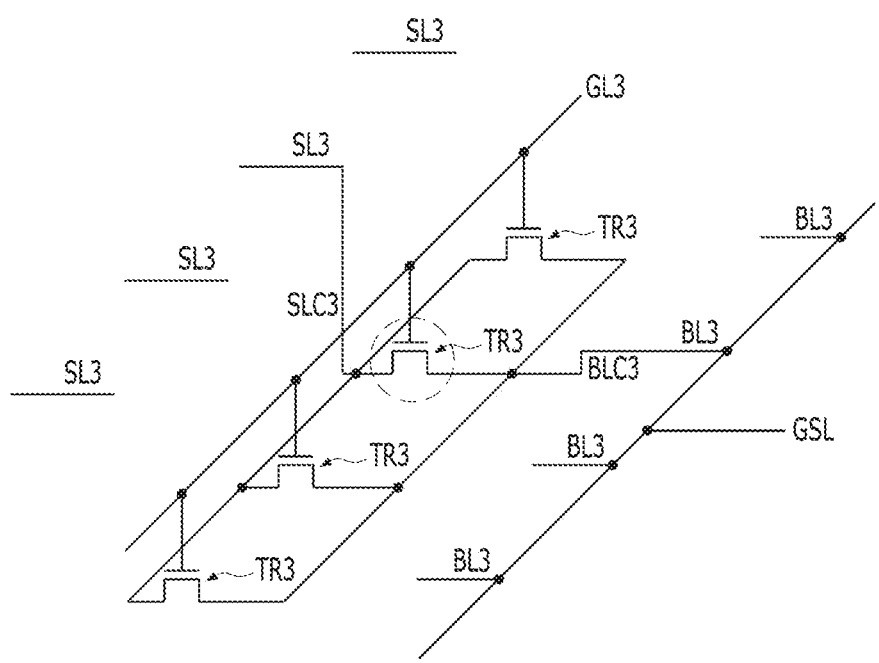
FIG. 15B is a diagram illustrating an equivalent circuit of a second switching region of a semiconductor memory in accordance with another implementation.

FIG. 15A is a diagram illustrating an equivalent circuit of a first switching region of a semiconductor memory in accordance with another implementation, and FIG. 15B is a diagram illustrating an equivalent circuit of a second switching region of a semiconductor memory in accordance with another implementation.

Referring to FIG. 15A, gates of a plurality of first transistors TR1 may be coupled to a first gate line GL1 extending in the first direction. Therefore, the plurality of first transistors TR1 may be arranged in the first direction along the first gate line GL1.

Each of the first transistors TR1 may include a source and a drain. Here, a plurality of the sources arranged in the first direction may be coupled with each other. Also, a plurality of the drains arranged in the first direction may be coupled with each other.

Therefore, the plurality of the sources may be coupled to a corresponding one of first source lines SL1 via a first source line contact SLC1. Also, the plurality of the drains may be coupled to a corresponding one of first bit lines BL1 via a first bit line contact BLC1.

The first source lines SL1 may be commonly coupled to a global bit line GBL.

The first bit lines BL1 may be coupled to bit lines of a mat region (not shown), respectively.

Referring to FIG. 15B, gates of a plurality of third transistors TR3 may be coupled to a third gate line GL3 extending in the first direction. Therefore, the plurality of third transistors TR3 may be arranged in the first direction along the third gate line GL3.

Each of the third transistors TR3 may include a source and a drain. Here, a plurality of the sources arranged in the first direction may be coupled with each other. Also, a plurality of the drains arranged in the first direction may be coupled with each other.

Therefore, the plurality of the sources may be coupled to a corresponding one of third source lines SL3 via a third source line contact SLC3. Also, the plurality of the drains may be coupled to a corresponding one of third bit lines BL3 via a third bit line contact BLC3.

The third source lines SL3 may be coupled to source lines of a mat region (not shown), respectively.

The third bit lines BL3 may be commonly coupled to a global source line GSL.

Figure 16A:
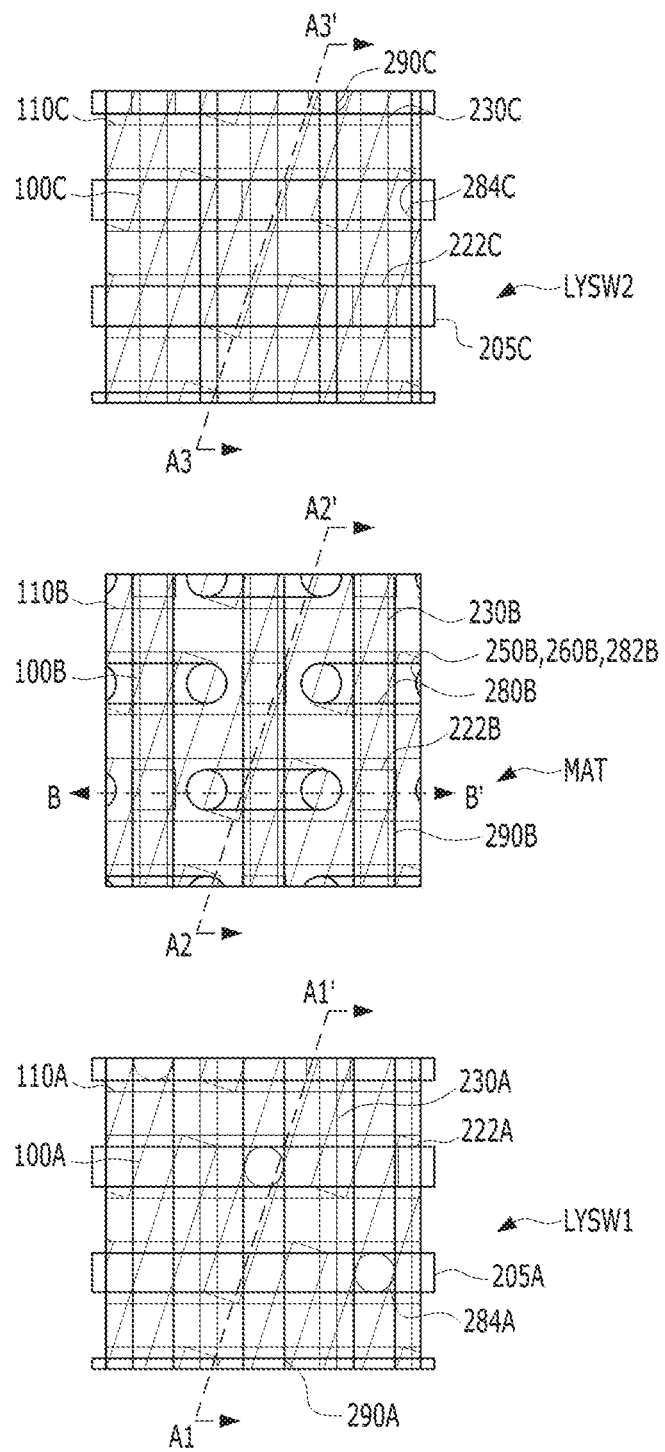
FIGS. 16A and 16B are diagrams illustrating a semiconductor memory including the first and second switching regions of FIGS. 15A and 15B, and a method for fabricating the same.
Figure 16B:
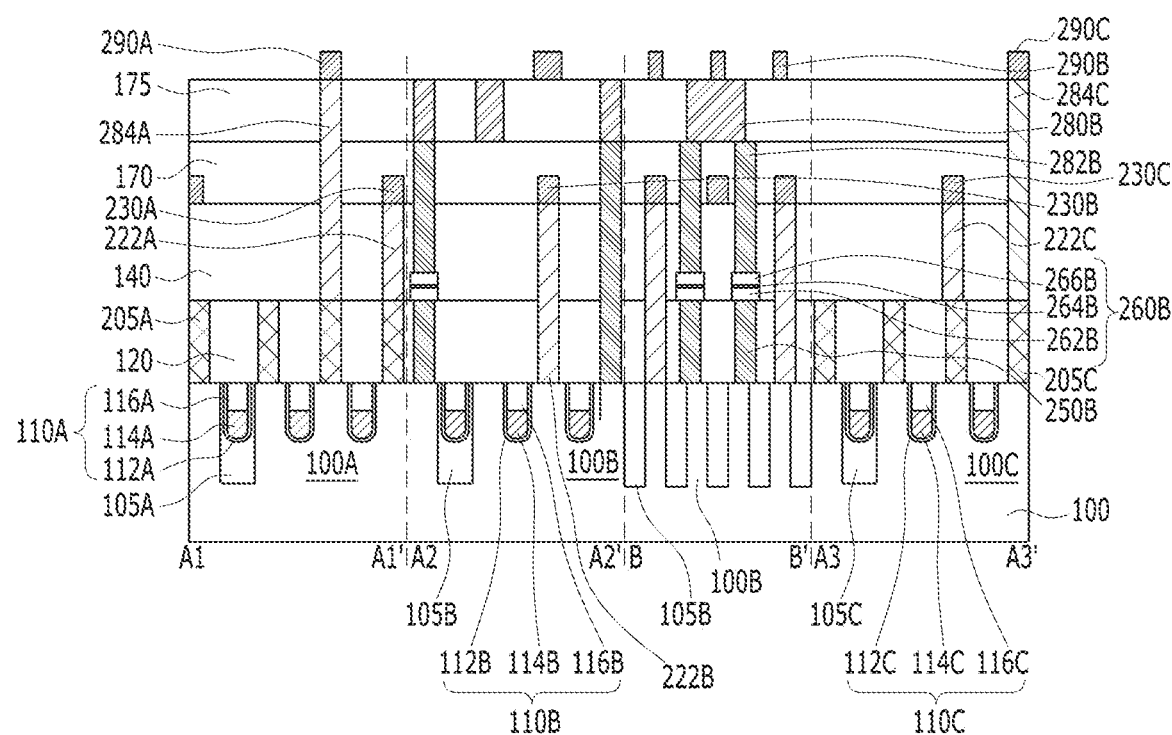

FIGS. 16A and 16B are diagrams illustrating a semiconductor memory including the first and second switching regions of FIGS. 15A and 15B, and a method for fabricating the same. FIG. 16A shows a plan view, and FIG. 16B shows a cross-sectional view taken along a line A1-A1', a line A2-A2', a line B-B' and a line A3-A3' of FIG. 16A. In the present implementation, differences from the implementation of FIGS. 12A and 12B will be described in detail. However, other implementations, that is, the implementations of FIGS. 3A to 8B, FIGS. 13A and 13B, FIGS. 14A and 14B and the like may be applied to the present implementation.

Referring to FIGS. 16A and 16B, a plurality of first active regions 100A may be defined by forming a first isolation layer 105A in a substrate 100 of a first switching region LYSW1, a plurality of second active regions 100B may be defined by forming a second isolation layer 105B in the substrate 100 of a mat region MAT, and a plurality of third active regions 100C may be defined by forming a third isolation layer 105C in the substrate 100 of a second switching region LYSW2.

Then, first gate structures 110A may be formed in the substrate 100 of the first switching region LYSW1, second gate structures 110B may be formed in the substrate 100 of the mat region MAT, and third gate structures 110C may be formed in the substrate 100 of the second switching region LYSW2.

Then, a first interlayer insulating layer 120 may be formed to cover a resultant structure in which the first to third gate structures 110A, 110B and 110C are formed, and then, lower contacts 250B may be formed to penetrate through the first interlayer insulating layer 120 of the mat region MAT and be coupled to drain regions of the second active regions 100B, respectively. Also, first line contacts 205A penetrating through the first interlayer insulating layer 120 of the first switching region LYSW1 may be formed to be located between the first gate structures 110A and extend in the first direction. Also, second line contacts 205C penetrating through the first interlayer insulating layer 120 of the second switching region LYSW2 may be formed to be located between the third gate structures 110C and extend in the first direction.

Here, each of the first line contacts 205A may be coupled to first side portions, middle portions and second side portions of the first active regions 100A arranged in the first direction between the first gate structures 110A. As a result, each of the first line contacts 205A may couple junction regions located at a side of the first gate structure 110A with each other, and couple junction regions located at the other side of the first gate structure 110A with each other. Similarly, each of the second line contacts 205C may couple junction regions located at a side of the third gate structure 110C with each other, and couple junction regions located at the other side of the third gate structure 110C with each other. Therefore, connections between the source regions and between the drain regions may be provided as described in FIGS. 15A and 15B.

In the present implementation, the first and second line contacts 205A and 205C may be formed by selectively etching the first interlayer insulating layer 120 to provide a space in which the first and second line contacts 205A and 205C are to be formed and filling the space with a conductive material. The first and second line contacts 205A and 205C may be formed together with the lower contacts 250B. However, other implementations are also possible. For example, the forming process of the first and second line contacts 205A and 205C may be performed separately from the forming process of the upper contacts 250B. Also, the first and second line contacts 205A and 205C may be formed by a deposition process of a conductive material and a patterning process before the first interlayer insulating layer 120 is formed.

Subsequent processes may be substantially the same as described in FIGS. 12A and 12B. However, bottom surfaces of the first source line contacts 222A and the first bit line contacts 284A may be in a direct contact with the first line contacts 205A while not being in a direct contact with the first active regions 100A. Also, bottom surfaces of the third source line contacts 222C and the third bit line contacts 284C may be in a direct contact with the second line contacts 205C while not being in a direct contact with the third active regions 100C.

By the present implementation, since a plurality of transistors which are coupled in parallel in the first and second switching regions LYSW1 and LYSW2 are provided, one or more undesired effects of the resistance of the transistors to the operation of the memory device may be further reduced.

Meanwhile, in the present implementation, the number of the transistors which are coupled in parallel may be easily adjusted by adjusting a length of each of the first line contact 205A and the second line contact 205C. For example, when 8 transistors are coupled in parallel to the first gate structure 110A, the first line contact 205A may extend to overlap 8 junction regions of the first active regions 100A, which are arranged in the first direction at a side of the first gate structure 110A. One first line contact 205A overlapping 8 junctions regions and another first line contact 205A adjacent to the one first line contact 205A in the first direction and overlapping another 8 junction regions may be separated from each other by a certain space.

In accordance with the electronic device of these implementations, it is possible to improve characteristics of memory cells, increase a degree of integration, and reduce a cost and a level of difficulty of fabricating processes.

The above and other memory circuits or semiconductor devices based on the disclosed technology can be used in a range of devices or systems. FIGS. 17-21 provide some examples of devices or systems that can implement the memory circuits disclosed herein.

Figure 17:
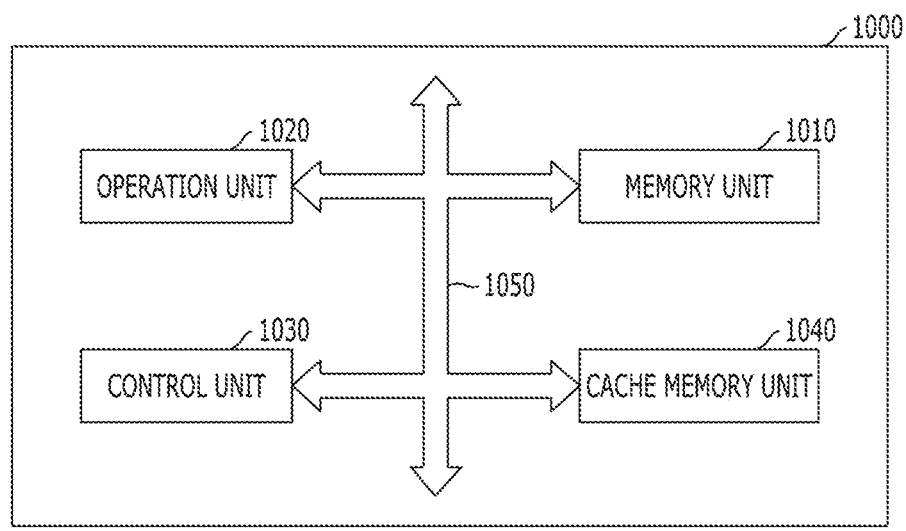
FIG. 17 is an example of configuration diagram of a microprocessor implementing memory circuitry based on the disclosed technology.

FIG. 17 is an example of configuration diagram of a microprocessor implementing memory circuitry based on the disclosed technology.

Referring to FIG. 17, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a mat region comprising a plurality of memory cells, each of the memory cells including a second transistor and a memory element coupled to the second transistor; a first switching region located at a side of the mat region and including a plurality of first transistors coupled to first ends of the memory cells; and a second switching region located at the other side of the mat region with respect to the first switching region and including a plurality of third transistors coupled to second ends of the memory cells, wherein the second transistors comprise: a plurality of second active regions elongated in a third direction that crosses first and second directions which are substantially perpendicular to each other, the plurality of second active regions being arranged in a row in the second direction and the third direction; and a plurality of second gate structures extending in the first direction to cross the second active regions, wherein each of the second active regions is divided into a first side portion, a middle portion and a second side portion by a pair of the second gate structures, and the first side portion, the second side portion and the middle portion are arranged alternately and repeatedly in the first direction, wherein the first transistors include first active regions and first gate structures which are arranged in the same manner as the second active regions and the second gate structures, and wherein the third transistors include third active regions and third gate structures which are arranged in the same manner as the second active regions and the second gate structures. Through this, characteristics of memory cells of the memory unit 1010 may be improved, and an increase in a degree of integration and a decrease in a level of difficulty of processes may be possible. As a result, an operating characteristic of the microprocessor 1000 may be improved, and an increase in a degree of integration and a decrease in a level of difficulty of processes may be possible.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 18:
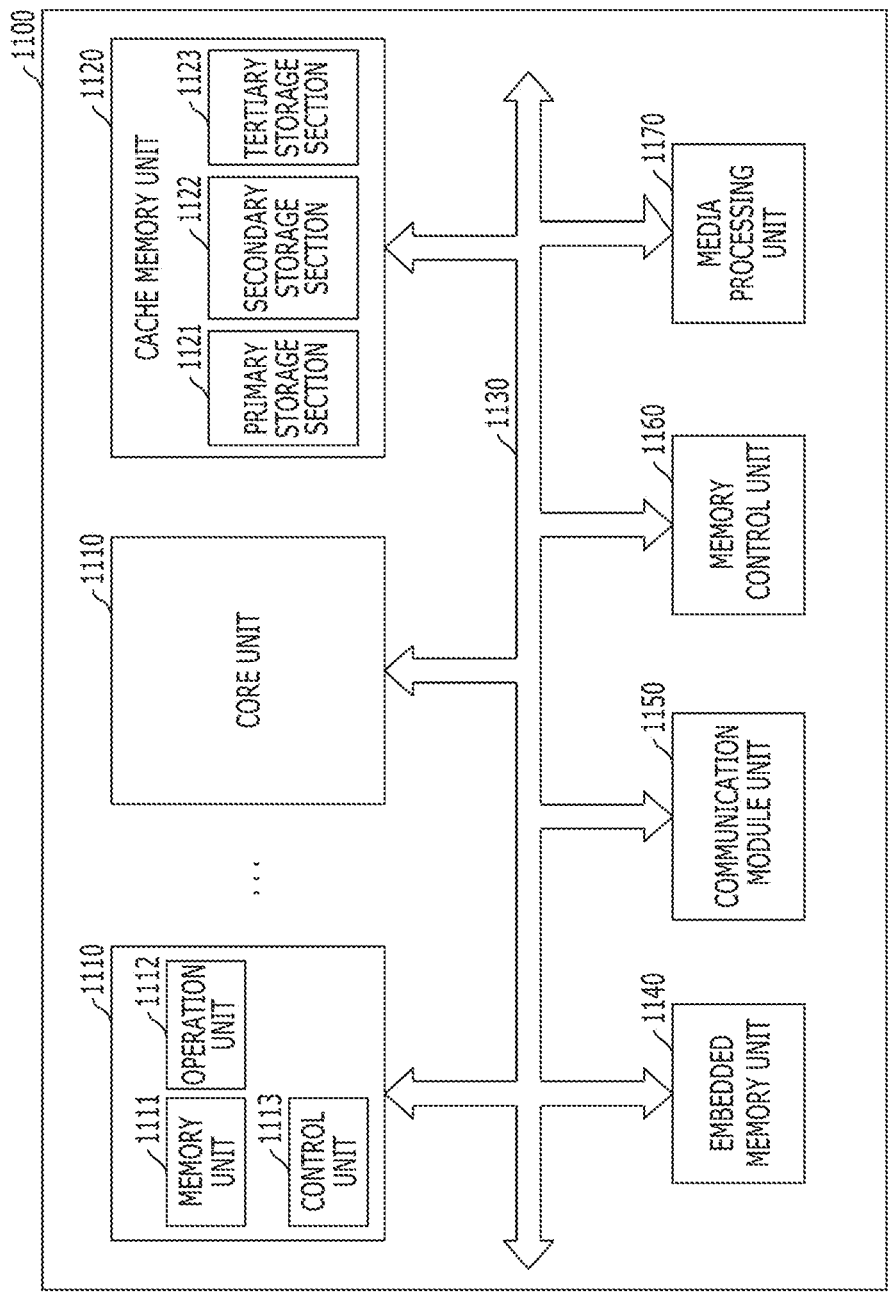
FIG. 18 is an example of configuration diagram of a processor implementing memory circuitry based on the disclosed technology.

FIG. 18 is an example of configuration diagram of a processor implementing memory circuitry based on the disclosed technology.

Referring to FIG. 18, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a mat region comprising a plurality of memory cells, each of the memory cells including a second transistor and a memory element coupled to the second transistor; a first switching region located at a side of the mat region and including a plurality of first transistors coupled to first ends of the memory cells; and a second switching region located at the other side of the mat region with respect to the first switching region and including a plurality of third transistors coupled to second ends of the memory cells, wherein the second transistors comprise: a plurality of second active regions elongated in a third direction that crosses first and second directions which are substantially perpendicular to each other, the plurality of second active regions being arranged in a row in the second direction and the third direction; and a plurality of second gate structures extending in the first direction to cross the second active regions, wherein each of the second active regions is divided into a first side portion, a middle portion and a second side portion by a pair of the second gate structures, and the first side portion, the second side portion and the middle portion are arranged alternately and repeatedly in the first direction, wherein the first transistors include first active regions and first gate structures which are arranged in the same manner as the second active regions and the second gate structures, and wherein the third transistors include third active regions and third gate structures which are arranged in the same manner as the second active regions and the second gate structures. Through this, characteristics of memory cells of the cache memory unit 1120 may be improved, and an increase in a degree of integration and a decrease in a level of difficulty of processes may be possible. As a result, an operating characteristic of the processor 1100 may be improved, and an increase in a degree of integration and a decrease in a level of difficulty of processes may be possible.

Although it was shown in FIG. 18 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MIVIC), an embedded MIVIC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 19:
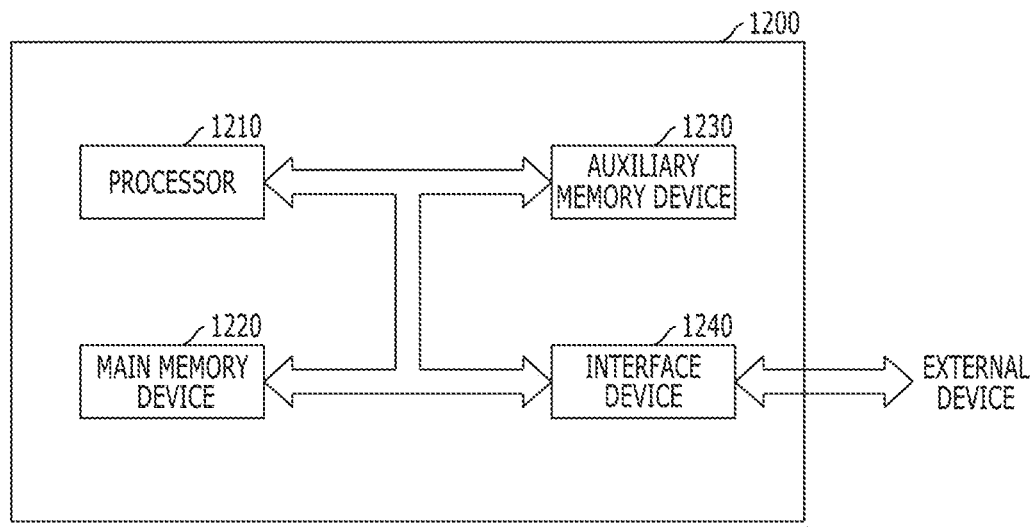
FIG. 19 is an example of configuration diagram of a system implementing memory circuitry based on the disclosed technology.

FIG. 19 is an example of configuration diagram of a system implementing memory circuitry based on the disclosed technology.

Referring to FIG. 19, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a mat region comprising a plurality of memory cells, each of the memory cells including a second transistor and a memory element coupled to the second transistor; a first switching region located at a side of the mat region and including a plurality of first transistors coupled to first ends of the memory cells; and a second switching region located at the other side of the mat region with respect to the first switching region and including a plurality of third transistors coupled to second ends of the memory cells, wherein the second transistors comprise: a plurality of second active regions elongated in a third direction that crosses first and second directions which are substantially perpendicular to each other, the plurality of second active regions being arranged in a row in the second direction and the third direction; and a plurality of second gate structures extending in the first direction to cross the second active regions, wherein each of the second active regions is divided into a first side portion, a middle portion and a second side portion by a pair of the second gate structures, and the first side portion, the second side portion and the middle portion are arranged alternately and repeatedly in the first direction, wherein the first transistors include first active regions and first gate structures which are arranged in the same manner as the second active regions and the second gate structures, and wherein the third transistors include third active regions and third gate structures which are arranged in the same manner as the second active regions and the second gate structures. Through this, characteristics of memory cells of the main memory device 1220 may be improved, and an increase in a degree of integration and a decrease in a level of difficulty of processes may be possible. As a result, an operating characteristic of the system 1200 may be improved, and an increase in a degree of integration and a decrease in a level of difficulty of processes may be possible.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a mat region comprising a plurality of memory cells, each of the memory cells including a second transistor and a memory element coupled to the second transistor; a first switching region located at a side of the mat region and including a plurality of first transistors coupled to first ends of the memory cells; and a second switching region located at the other side of the mat region with respect to the first switching region and including a plurality of third transistors coupled to second ends of the memory cells, wherein the second transistors comprise: a plurality of second active regions elongated in a third direction that crosses first and second directions which are substantially perpendicular to each other, the plurality of second active regions being arranged in a row in the second direction and the third direction; and a plurality of second gate structures extending in the first direction to cross the second active regions, wherein each of the second active regions is divided into a first side portion, a middle portion and a second side portion by a pair of the second gate structures, and the first side portion, the second side portion and the middle portion are arranged alternately and repeatedly in the first direction, wherein the first transistors include first active regions and first gate structures which are arranged in the same manner as the second active regions and the second gate structures, and wherein the third transistors include third active regions and third gate structures which are arranged in the same manner as the second active regions and the second gate structures. Through this, characteristics of memory cells of the auxiliary memory device 1230 may be improved, and an increase in a degree of integration and a decrease in a level of difficulty of processes may be possible. As a result, an operating characteristic of the system 1200 may be improved, and an increase in a degree of integration and a decrease in a level of difficulty of processes may be possible.

Also, the auxiliary memory device 1230 may further include a data storage system (see the reference numeral 1300 of FIG. 19) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 19) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 20:
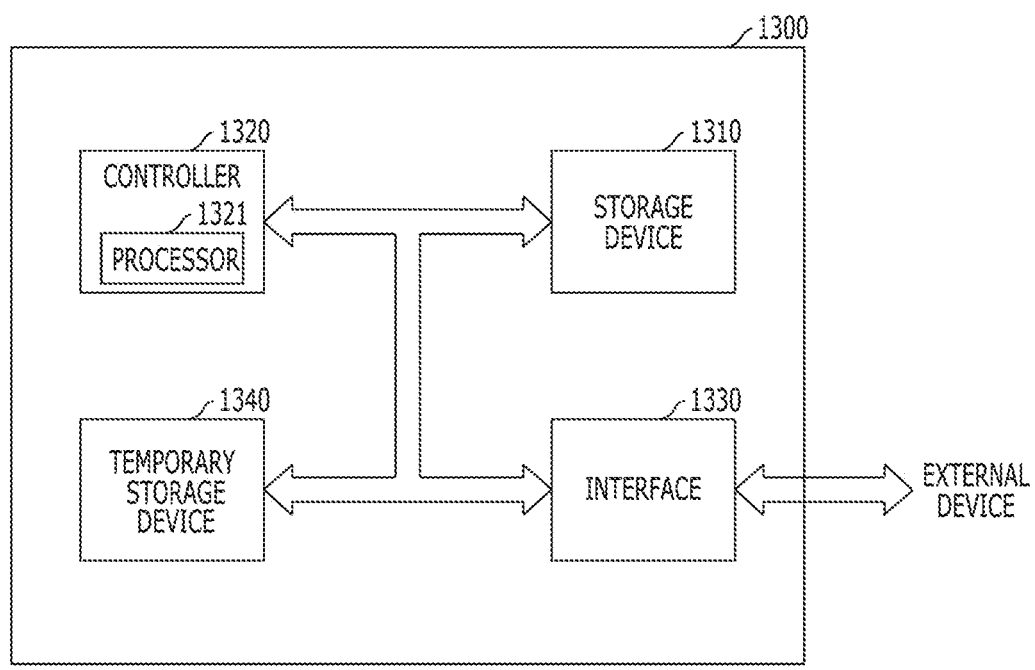
FIG. 20 is an example of configuration diagram of a data storage system implementing memory circuitry based on the disclosed technology.

FIG. 20 is an example of configuration diagram of a data storage system implementing memory circuitry based on the disclosed technology.

Referring to FIG. 20, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a mat region comprising a plurality of memory cells, each of the memory cells including a second transistor and a memory element coupled to the second transistor; a first switching region located at a side of the mat region and including a plurality of first transistors coupled to first ends of the memory cells; and a second switching region located at the other side of the mat region with respect to the first switching region and including a plurality of third transistors coupled to second ends of the memory cells, wherein the second transistors comprise: a plurality of second active regions elongated in a third direction that crosses first and second directions which are substantially perpendicular to each other, the plurality of second active regions being arranged in a row in the second direction and the third direction; and a plurality of second gate structures extending in the first direction to cross the second active regions, wherein each of the second active regions is divided into a first side portion, a middle portion and a second side portion by a pair of the second gate structures, and the first side portion, the second side portion and the middle portion are arranged alternately and repeatedly in the first direction, wherein the first transistors include first active regions and first gate structures which are arranged in the same manner as the second active regions and the second gate structures, and wherein the third transistors include third active regions and third gate structures which are arranged in the same manner as the second active regions and the second gate structures. Through this, characteristics of memory cells of the temporary storage device 1340 may be improved, and an increase in a degree of integration and a decrease in a level of difficulty of processes may be possible. As a result, an operating characteristic and a data storage characteristic of the data storage system 1300 may be improved, and an increase in a degree of integration and a decrease in a level of difficulty of processes may be possible.

Figure 21:
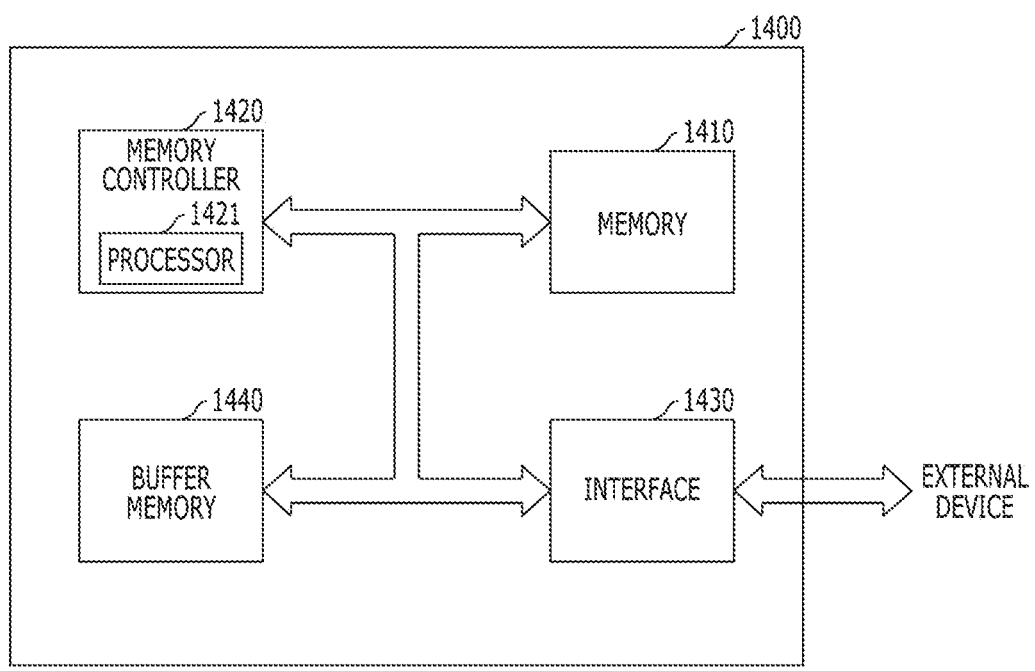
FIG. 21 is an example of configuration diagram of a memory system implementing memory circuitry based on the disclosed technology.

FIG. 21 is an example of configuration diagram of a memory system implementing memory circuitry based on the disclosed technology.

Referring to FIG. 21, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a mat region comprising a plurality of memory cells, each of the memory cells including a second transistor and a memory element coupled to the second transistor; a first switching region located at a side of the mat region and including a plurality of first transistors coupled to first ends of the memory cells; and a second switching region located at the other side of the mat region with respect to the first switching region and including a plurality of third transistors coupled to second ends of the memory cells, wherein the second transistors comprise: a plurality of second active regions elongated in a third direction that crosses first and second directions which are substantially perpendicular to each other, the plurality of second active regions being arranged in a row in the second direction and the third direction; and a plurality of second gate structures extending in the first direction to cross the second active regions, wherein each of the second active regions is divided into a first side portion, a middle portion and a second side portion by a pair of the second gate structures, and the first side portion, the second side portion and the middle portion are arranged alternately and repeatedly in the first direction, wherein the first transistors include first active regions and first gate structures which are arranged in the same manner as the second active regions and the second gate structures, and wherein the third transistors include third active regions and third gate structures which are arranged in the same manner as the second active regions and the second gate structures. Through this, characteristics of memory cells of the memory 1410 may be improved, and an increase in a degree of integration and a decrease in a level of difficulty of processes may be possible. As a result, an operating characteristic and a data storage characteristic of the memory system 1400 may be improved, and an increase in a degree of integration and a decrease in a level of difficulty of processes may be possible.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a mat region comprising a plurality of memory cells, each of the memory cells including a second transistor and a memory element coupled to the second transistor; a first switching region located at a side of the mat region and including a plurality of first transistors coupled to first ends of the memory cells; and a second switching region located at the other side of the mat region with respect to the first switching region and including a plurality of third transistors coupled to second ends of the memory cells, wherein the second transistors comprise: a plurality of second active regions elongated in a third direction that crosses first and second directions which are substantially perpendicular to each other, the plurality of second active regions being arranged in a row in the second direction and the third direction; and a plurality of second gate structures extending in the first direction to cross the second active regions, wherein each of the second active regions is divided into a first side portion, a middle portion and a second side portion by a pair of the second gate structures, and the first side portion, the second side portion and the middle portion are arranged alternately and repeatedly in the first direction, wherein the first transistors include first active regions and first gate structures which are arranged in the same manner as the second active regions and the second gate structures, and wherein the third transistors include third active regions and third gate structures which are arranged in the same manner as the second active regions and the second gate structures. Through this, characteristics of memory cells of the buffer memory 1440 may be improved, and an increase in a degree of integration and a decrease in a level of difficulty of processes may be possible. As a result, an operating characteristic and a data storage characteristic of the memory system 1400 may be improved, and an increase in a degree of integration and a decrease in a level of difficulty of processes may be possible Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 17-21 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory, wherein the semiconductor memory comprises:
   a mat region comprising a plurality of memory cells, second source line contacts, stack structures, upper contacts, second source lines, and second bit lines, each of the memory cells including a second transistor and a memory element coupled to the second transistor;
   a first switching region located at a side of the mat region and including a plurality of first transistors coupled to first ends of the memory cells; and
   a second switching region located at the other side of the mat region with respect to the first switching region and including a plurality of third transistors coupled to second ends of the memory cells,
   wherein the second transistors comprise:
   a plurality of second active regions elongated in a third direction that is different from first and second directions which are substantially perpendicular to each other, the plurality of second active regions being arranged in a row in the second direction and the third direction; and
   a plurality of second gate structures extending in the first direction to cross the second active regions, wherein each of the second active regions is divided into a first side portion, a middle portion and a second side portion by a pair of the second gate structures, and the first side portion, the second side portion and the middle portion are arranged alternately and repeatedly in the first direction,
   wherein the first transistors include:
   a plurality of first active regions elongated in the third direction, the plurality of first active regions being arranged in a row in the second direction and the third direction; and
   a plurality of first gate structures extending in the first direction to cross the plurality of first active regions, and
   wherein each of the first active regions is divided into a first side portion, a middle portion and a second side portion by a pair of the first gate structures, and the first side portion, the second side portion and the middle portion are arranged alternately and repeatedly in the first direction, and
   wherein the third transistors include:
   a plurality of third active regions elongated in the third direction, the plurality of third active regions being arranged in a row in the second direction and the third direction; and
   a plurality of third gate structures extending in the first direction to cross the third active regions,
   wherein each of the third active regions is divided into a first side portion, a middle portion and a second side portion by a pair of the third gate structures, and the first side portion, the second side portion and the middle portion are arranged alternately and repeatedly in the first direction,
   wherein each of the second source line contacts is located over and coupled to the middle portion of the second active region;
   wherein each of the stack structures includes a lower contact, and each of the stack structures is located over and coupled to each of the first side portion and the second side portion of the second active region;
   wherein each of the upper contacts is located over and commonly coupled to a pair of the stack structures which are adjacent to each other in the first direction while each of the upper contacts is not overlapping the second source line contacts;
   wherein each of the second source lines is located over and coupled to the second source line contacts, and extending in the second direction; and
   wherein each of the second bit lines is located over and coupled to the upper contacts, and extending in the second direction.

2. The electronic device of claim 1, wherein the second bit lines are located over and overlap the second source lines, respectively.

3. The electronic device of claim 1, wherein the stack structures further comprise additional upper contacts, and each of the additional upper contacts is located over and coupled to the memory element.

4. The electronic device of claim 1, wherein a bottom surface of the memory element is located over a top surface of the second source line.

5. The electronic device of claim 1, wherein a top surface of the memory element is located under a bottom surface of the second source line, and
   a top surface of the second source line is located under a bottom surface of the second bit line.

6. The electronic device of claim 1, wherein, when the first active regions arranged in the second direction are referred to as a first active region row, a plurality of first active region rows are arranged in the first direction, and a selected first gate structure of the first gate structures crosses a selected first active region row of the first active region rows, and
   when the third active regions arranged in the second direction are referred to as a third active region row, a plurality of third active region rows are arranged in the first direction, and a selected third gate structure of the third gate structures crosses a selected third active region row of the third active region rows,
   the first switching region further comprises:
   first source line contacts and first bit line contacts, each first source line contact and each first bit line contact being located over and coupled to the selected first active region while being located at both sides of the selected first gate structure, respectively;
   first source lines, each located over and coupled to the first source line contact, and extending in the second direction; and
   first bit lines, each located over and coupled to the first bit line contact, and extending in the second direction, and
   the second switching region further comprises:

third source line contacts and third bit line contacts, each third source line contact and each third bit line contact being located over and coupled to the selected third active region while being located at both sides of the selected third gate structure, respectively;

third source lines, each located over and coupled to the third source line contact, and extending in the second direction; and third bit lines, each located over and coupled to the third bit line contact, and extending in the second direction.

7. The electronic device of claim 6, wherein the first bit lines and the second bit lines are electrically coupled to each other, respectively, while the first source lines and the second source lines are electrically separated from each other, and the second source lines and the third source lines are electrically coupled to each other, respectively, while the second bit lines and the third bit lines are electrically separated from each other.

8. The electronic device of claim 6, wherein the first to third source lines are located at a same height, and the first to third bit lines are located at a same height and over the first to third source lines.

9. The electronic device of claim 6, wherein, in the first direction, the first bit lines and the second bit lines are formed in positions corresponding to each other, and the second source lines and the third source lines are formed in positions corresponding to each other.

10. The electronic device of claim 6, wherein, in the first direction, the first bit lines and the second bit lines are formed in different positions, and the semiconductor memory further comprises:

lines having curved shapes, provided between the first switching region and the mat region and coupling the first bit lines and the second bit lines with each other.

11. The electronic device of claim 6, wherein the first source line contacts are arranged in a row along a fourth direction which crosses the first to third directions, the first bit line contacts are arranged in a row along the fourth direction, the third source line contacts are arranged in a row along the fourth direction, and the third bit line contacts are arranged in a row along the fourth direction.

12. The electronic device of claim 6, wherein, when the first source line contact and the first bit line contact are located at a first side and a second side of the selected first gate structure, respectively, the third source line contact and the third bit line contact are located at a second side and a first side of the selected third gate structure, respectively.

13. The electronic device of claim 12, wherein the first source lines and the first bit lines are arranged alternately and repeatedly in the first direction, the third source lines and the third bit lines are arranged alternately and repeatedly in the first direction, and in the first direction, the first bit lines, the second source lines, the second bit lines and the third source lines are formed in positions corresponding to each other.

14. The electronic device of claim 6, wherein, when the first source line contact and the first bit line contact are located at a first side and a second side of the selected first gate structure, respectively, the third source line contact and the third bit line contact are located at a first side and a second side of the selected third gate structure, respectively.

15. The electronic device of claim 14, wherein the first source lines and the first bit lines are arranged alternately and repeatedly in the first direction, the third source lines and the third bit lines are arranged alternately and repeatedly in the first direction, and in the first direction, the first source lines, the second source lines, the second bit lines and the third source lines are formed in positions corresponding to each other.

16. The electronic device of claim 14, wherein the first switching region further comprises:

additional first bit line contacts, each located over and coupled to the first bit line contact while protruding toward the first source line which is adjacent to and located at a side of the first bit line contact to overlap the first source line, and the first bit line is located over and coupled to the additional first bit line contact while extending in the second direction to overlap the first source line.

17. The electronic device of claim 16, wherein the third source lines and the third bit lines are arranged alternately and repeatedly in the first direction, and in the first direction, the first source lines, the first bit lines, the second source lines, the second bit lines and the third source lines are formed in positions corresponding to each other.

18. The electronic device of claim 6, wherein the first switching region further comprises:

first line contacts, each located between two adjacent first gate structures and extending in the first direction to couple the first active regions which are arranged in the first direction to each other, the second switching region further comprises:

second line contacts, each located between two adjacent third gate structures and extending in the first direction to couple the third active regions which are arranged in the first direction to each other, the first source line contacts and the first bit line contacts are located over and coupled to the first line contacts, and the third source line contacts and the third bit line contacts are located over and coupled to the second line contacts.

19. The electronic device of claim 7, wherein a current flow is generated to read or write a data in the variable resistance element, the current flow passing the first source line, the first source line contact, the first transistor, the first bit line contact, the first bit line, the second bit line, the upper contact, the memory element, the lower contact, the second transistor, the second source line contact, the second source line, the third source line, the third source line contact, the third transistor, the third bit line contact, and the third bit line.

* * * * *